(12) United States Patent
Takamoto et al.

(10) Patent No.: US 10,211,083 B2
(45) Date of Patent: Feb. 19, 2019

(54) FILM FOR FLIP CHIP TYPE SEMICONDUCTOR BACK SURFACE AND ITS USE

(71) Applicant: NITTO DENKO CORPORATION, Ibaraki-shi, Osaka (JP)

(72) Inventors: Naohide Takamoto, Osaka (JP); Goji Shiga, Osaka (JP); Fumiteru Asai, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 0 days.

(21) Appl. No.: 14/191,562

(22) Filed: Feb. 27, 2014

(65) Prior Publication Data

US 2014/0178680 A1 Jun. 26, 2014

Related U.S. Application Data

(63) Continuation of application No. 13/191,950, filed on Jul. 27, 2011.

(30) Foreign Application Priority Data

Jul. 29, 2010 (JP) .................................. 2010-170807

(51) Int. Cl.
  *H01L 21/683* (2006.01)
  *H01L 23/31* (2006.01)
  *H01L 23/00* (2006.01)

(52) U.S. Cl.
  CPC ...... *H01L 21/6836* (2013.01); *H01L 23/3164* (2013.01); *H01L 24/81* (2013.01);
  (Continued)

(58) Field of Classification Search
  CPC ..... H01L 21/76898; H01L 2225/06541; H01L 24/03; H01L 24/11; H01L 2924/00014;
  (Continued)

(56) References Cited

U.S. PATENT DOCUMENTS 4,566,935 A * 1/1986 Hornbeck ..................... 438/29
4,596,992 A * 6/1986 Hornbeck ..................... 347/134
(Continued)

FOREIGN PATENT DOCUMENTS

| CN | 1542076 A | 11/2004 |
|----|-----------|---------|
| CN | 1671609 A | 9/2005 |

(Continued)

OTHER PUBLICATIONS

Office Action dated Mar. 25, 2013 from the Japanese Patent Office in counterpart application No. 2010-170807.
(Continued)

*Primary Examiner* — Edward Chin
(74) *Attorney, Agent, or Firm* — Sughrue Mion, PLLC

(57) ABSTRACT

The present invention relates to a film for flip chip type semiconductor back surface, which is to be disposed on a back surface of a semiconductor element flip chip-connected onto an adherend, the film for flip chip type semiconductor back surface including an adhesive layer and a protective layer laminated on the adhesive layer, in which the protective layer is constituted of a heat-resistant resin having a glass transition temperature of 200° C. or more or a metal.

4 Claims, 2 Drawing Sheets

(52) U.S. Cl.
CPC ............ *H01L 2221/68327* (2013.01); *H01L 2221/68377* (2013.01); *H01L 2224/13111* (2013.01); *H01L 2224/13144* (2013.01); *H01L 2224/13147* (2013.01); *H01L 2224/16225* (2013.01); *H01L 2224/16227* (2013.01); *H01L 2224/814* (2013.01); *H01L 2224/81007* (2013.01); *H01L 2224/81024* (2013.01); *H01L 2224/8191* (2013.01); *H01L 2224/81193* (2013.01); *H01L 2224/81815* (2013.01); *H01L 2924/12042* (2013.01); *H01L 2924/14* (2013.01); *Y10T 428/28* (2015.01); *Y10T 428/2804* (2015.01); *Y10T 428/31504* (2015.04); *Y10T 428/31721* (2015.04); *Y10T 428/31855* (2015.04)

(58) Field of Classification Search
CPC ..... H01L 2224/131; H01L 2224/32245; H01L 2224/83192; H01L 2224/83862; H01L 2224/83874; H01L 2224/92242; H01L 2224/97; H01L 2224/16225; H01L 2224/81; H01L 2224/83; H01L 2924/00
USPC ........... 257/E27.006, E27.009, 621, 414, 48, 257/E21.205, E21.499, 23.079, E23.102, 257/E23.141, E23.169, E23.174, E23.178, 257/692, 706, 713, 723; 438/107, 17, 438/459, 637, 676, 122, 184
See application file for complete search history.

(56) References Cited

U.S. PATENT DOCUMENTS

| | | | |
|---|---|---|---|
| 4,956,619 A * | 9/1990 | Hornbeck ...................... 359/317 |
| 5,028,939 A * | 7/1991 | Hornbeck et al. ............. 347/131 |
| 5,073,423 A * | 12/1991 | Johnson ................ B44C 1/1712 428/195.1 |
| 5,250,329 A * | 10/1993 | Miracky et al. ............... 427/556 |
| 5,496,691 A * | 3/1996 | Miyamoto ............... G03C 1/81 430/527 |
| 6,284,122 B1 * | 9/2001 | Memmi .................... C23C 2/02 205/220 |
| 6,478,918 B2 | 11/2002 | Bennett et al. |
| 6,562,454 B2 | 5/2003 | Takahashi et al. |
| 6,617,787 B2 * | 9/2003 | Kato ........................ H01L 33/56 257/10 |
| 6,716,665 B2 * | 4/2004 | Baba ....................... H01L 21/56 257/E21.502 |
| 6,974,659 B2 | 12/2005 | Su et al. |
| 7,038,310 B1 * | 5/2006 | Nakatani ............... H01L 21/568 257/690 |
| 7,049,528 B2 | 5/2006 | Kariya et al. |
| 7,098,126 B2 | 8/2006 | Hsieh et al. |
| 7,109,591 B2 | 9/2006 | Hack et al. |
| 7,179,695 B2 | 2/2007 | Yanagisawa et al. |
| 7,198,996 B2 * | 4/2007 | Nakatani ............. H01L 21/4857 257/E21.205 |
| 7,402,503 B2 | 7/2008 | Hara |
| 7,608,929 B2 | 10/2009 | Hu |
| 7,640,660 B2 * | 1/2010 | Abe .................. H01L 23/49822 174/255 |
| 7,829,441 B2 | 11/2010 | Takamoto |
| 7,888,690 B2 | 2/2011 | Iwafuchi et al. |
| 7,932,615 B2 | 4/2011 | Rinne |
| 7,935,574 B2 | 5/2011 | Saiki et al. |
| 8,035,118 B2 | 10/2011 | Kususe et al. |
| 8,142,602 B2 | 3/2012 | Tanaka |
| 8,614,118 B2 * | 12/2013 | Haji ........................ H01L 24/83 257/E23.04 |
| 2001/0011575 A1 * | 8/2001 | Nakata .................. G06K 19/077 156/272.2 |
| 2004/0230000 A1 | 11/2004 | Misumi et al. |
| 2005/0000638 A1 * | 1/2005 | Yamamoto .......... H01L 21/6836 156/250 |
| 2005/0153079 A1 * | 7/2005 | Hieda ..................... B32B 27/08 428/1.2 |
| 2006/0009009 A1 | 1/2006 | Hara |
| 2006/0102987 A1 * | 5/2006 | Saiki ................ H01L 21/67092 257/632 |
| 2007/0107177 A1 | 5/2007 | Kawachi et al. |
| 2007/0260035 A1 | 11/2007 | Watanabe |
| 2008/0057306 A1 | 3/2008 | Sasaki et al. |
| 2009/0017579 A1 * | 1/2009 | Jeong .................. B81C 1/00039 438/106 |
| 2010/0013094 A1 | 1/2010 | Jo et al. |
| 2010/0081258 A1 | 4/2010 | Takamoto |
| 2010/0144120 A1 | 6/2010 | Segawa et al. |
| 2010/0148360 A1 | 6/2010 | Lin et al. |
| 2010/0224985 A1 * | 9/2010 | Michael .............. H01L 23/3114 257/692 |
| 2010/0267199 A1 * | 10/2010 | Hatakeyama ...... B23K 26/0057 438/107 |
| 2011/0147059 A1 * | 6/2011 | Ma .................... H01L 23/49822 174/258 |
| 2011/0156279 A1 * | 6/2011 | Takamoto ............. H01L 21/561 257/778 |
| 2011/0226513 A1 | 9/2011 | Chuma et al. |
| 2011/0278736 A1 | 11/2011 | Lin et al. |
| 2012/0025256 A1 | 2/2012 | Kususe et al. |
| 2012/0028416 A1 | 2/2012 | Takamoto et al. |
| 2012/0083119 A1 * | 4/2012 | Komuro ............ H01L 21/76898 438/667 |
| 2013/0256269 A1 * | 10/2013 | Nikkhoo ............... B08B 7/0035 216/67 |
| 2015/0357223 A1 * | 12/2015 | Takamoto ............. H01L 23/544 257/778 |

FOREIGN PATENT DOCUMENTS

| | | |
|---|---|---|
| CN | 1954015 A | 4/2007 |
| CN | 101130670 A | 2/2008 |
| CN | 101617395 A | 12/2009 |
| JP | 2-102567 A | 4/1990 |
| JP | 4-315452 A | 11/1992 |
| JP | 06-077283 A | 3/1994 |
| JP | 09-180973 A | 7/1997 |
| JP | 10-256431 A | 9/1998 |
| JP | 2002-208571 A | 7/2002 |
| JP | 2003-108008 A | 4/2003 |
| JP | 2004-063516 A | 2/2004 |
| JP | 2007-002173 A | 1/2007 |
| JP | 2007-158026 A | 6/2007 |
| JP | 2007-235022 A | 9/2007 |
| JP | 2008-166451 A | 7/2008 |
| JP | 2009237489 A * | 10/2009 |
| JP | 2010-031183 A | 2/2010 |
| JP | 2010-074144 A | 4/2010 |
| TW | 201133599 A1 | 10/2011 |

OTHER PUBLICATIONS

Office Action dated Jun. 10, 2013 issued by Japanese Foreign Patent Office in counterpart Japanese Application No. 2010-170807.
Office Action dated Jul. 25, 2013 issued by the People's Republic of China in counterpart Application No. 201110217073.2.
Communication dated Mar. 14, 2014 from the State Intellectual Property Office of P.R. China in a counterpart application No. 201110217073.2.
Communication from the Japanese Patent Office dated Mar. 14, 2014, in a counterpart Japanese application No. 2013-109200.
Notification of Third Office Action dated Jul. 16, 2014, issued by the State Intellectual Property Office of the People's Republic of China in counterpart Chinese Application No. 201110217073.2.
Notification of Reasons for Refusal dated Jul. 18, 2014, issued by the Japanese Patent Office in counterpart Japanese Application No. 2013-109200.
Office Action dated Jul. 17, 2014, issued by the United States Patent and Trademark Office in U.S. Appl. No. 13/191,950.

(56) References Cited

OTHER PUBLICATIONS

Office Action, Issued by the State Intellectual Property Office of P.R. China, dated Jan. 6, 2015, In counterpart Chinese Application No. 201110217073.2.
Office Action dated Dec. 10, 2014, issued by the Korean Intellectual Property Office in counterpart Korean Application No. 10-2011-0075099.
Office Action dated Apr. 7, 2015, issued by the Korean Intellectual Property Office in counterpart Korean Application No. 10-2011-0075099.
Notification of First Office Action dated Mar. 13, 2017, issued by the State Intellectual Property Office of P.R. China in counterpart Chinese application No. 201510557774.9.
Notification of Second Office Action dated Dec. 1, 2017, issued by the State Intellectual Property Office of P.R. China in counterpart Chinese application No. 201510557774.9.
Notice of Final Rejection dated Jul. 3, 2015 issued by Korean Intellectual Property Office in counterpart Korean Application No. 10-2011-0075099.
Notification of Third Office Action, Issued by the State Intellectual Property of P.R. China, dated Jun. 1, 2018, in counterpart Chinese Application No. 201510557774.9.

* cited by examiner

FILM FOR FLIP CHIP TYPE SEMICONDUCTOR BACK SURFACE AND ITS USE

This is a continuation of application Ser. No. 13/191,950 filed Jul. 27, 2011, which claims priority based on Japanese patent application No. 2010-170807 filed Jul. 29, 2010, the contents of which are hereby incorporated by reference into this application.

FIELD OF THE INVENTION

The present invention relates to a film for flip chip type semiconductor back surface and to a dicing tape-integrated film for semiconductor back surface using the same. The film for flip chip type semiconductor back surface is used for protecting the back surface of a semiconductor element such as a semiconductor chip and for enhancing the strength thereof. Moreover, the invention relates to a method for producing a semiconductor device using the dicing tape-integrated film for semiconductor back surface.

BACKGROUND OF THE INVENTION

Recently, thinning and miniaturization of a semiconductor device and its package have been increasingly demanded. Therefore, as the semiconductor device and its package, flip chip type semiconductor devices in which a semiconductor element such as a semiconductor chip is mounted (flip chip-connected) on a substrate by means of flip chip bonding have been widely utilized. In such flip chip connection, a semiconductor chip is fixed to a substrate in a form where the circuit face of the semiconductor chip is opposed to the electrode-formed face of the substrate. In such a semiconductor device or the like, there may be a case where the back surface of the semiconductor chip is protected with a protective film to prevent the semiconductor chip from damaging or the like (see, Patent Document 1). The film for back surface may be laser-marked to increase the product discrimination ability thereof (see, Patent Document 2).

Patent Document 1: JP-A-2007-158026
Patent Document 2: JP-A-2008-166451

As a typical procedure of flip chip connection, a solder bump and the like formed on a semiconductor chip surface to which a film for back surface is bonded are immersed in a flux, thereafter, the bump is brought into contact with an electrode formed on a substrate (a solder bump is further formed on the electrode as needed), and finally, the solder bump is allowed to melt to reflow connect the solder bump to the electrode. The flux has been used for the purposes of cleaning or oxidation prevention of the solder bump, improvement of solder wettability, and the like, at the time of soldering. By the procedure described above, good electrical connection between the semiconductor chip and the substrate can be formulated.

The flux is usually allowed to adhere to only the bump portion herein. However, the flux adheres to the film for back surface attached to a semiconductor chip back surface in some cases depending on working conditions. Then, when the reflow connection is performed while the flux adheres to the film for back surface, flux-derived stains occur on a surface of the film for back surface to cause a fear of deteriorating appearance properties or laser marking properties.

The invention has been made in consideration of the foregoing problem, and an object thereof is to provide a film for flip chip type semiconductor back surface, which can prevent the occurrence of stains even when a flux adheres thereto and can produce a semiconductor device having excellent appearance properties, a dicing tape-integrated film for semiconductor back surface using the same, and a method for producing the semiconductor device.

In order to solve the foregoing problem, the present inventors have made investigations. As a result, the inventors have found that a film for flip chip type semiconductor back surface, which can prevent the occurrence of flux-derived stains and can produce a semiconductor device having excellent appearance properties, can be provided by employing the following constitution, and have completed the invention.

Namely, the present invention provides a film for flip chip type semiconductor back surface, which is to be disposed on a back surface of a semiconductor element flip chip-connected onto an adherend, the film for flip chip type semiconductor back surface comprising an adhesive layer and a protective layer laminated on the adhesive layer, wherein the protective layer comprises a heat-resistant resin having a glass transition temperature of 200° C. or more or a metal.

In the film for semiconductor back surface, a layer composed of a heat-resistant resin having a glass transition temperature of 200° C. or more or a metal is formed as a protective layer, so that a flux component is finally evaporated without entering the protective layer, at reflow for flip chip bonding. As a result, the occurrence of the flux-derived stains on the film for semiconductor back surface can be prevented. The reason for such stain inhibition is estimated as follows, although it is not sure. When the flux adheres to the film for back surface having no protective layer, a molecular structure of the resin constituting the film for back surface is largely loosened at a reflow temperature. It becomes therefore easy for the flux component to enter the film for back surface, and the flux component finally remains in a state where both are partially compatible, resulting in the occurrence of the stains. On the other hand, in the film for semiconductor back surface of the invention, the protective layer composed of the heat-resistant resin having a glass transition temperature of 200° C. or more or the metal is provided. Accordingly, a micro structure (the molecular structure or an atomic structure) in the protective layer is inhibited from being loosened or not substantially loosened even at the reflow temperature, whereby the flux component is inhibited from entering the protective layer. The flux remaining on a surface of the film for semiconductor back surface is evaporated by heating at reflow. As a result, the occurrence of the flux-derived stains is prevented.

The above-mentioned heat-resistant resin is preferably at least one selected from the group consisting of a polyimide, a polyphenylene sulfide, a polysulfone, a polyether imide, a polyether ketone and a polyether ether ketone. These resins can efficiently prevent the occurrence of the flux-derived stains because of their easy availability, rigid molecular structure and extremely high glass transition temperature. Of these, polyimide is preferred as the heat-resistant resin.

The above-mentioned metal is preferably at least one selected from the group consisting of aluminum, alumite, stainless steel, iron, titanium, tin and copper. These metals can exhibit not only an effect of preventing the occurrence of the flux-derived stains, but also excellent laser marking properties.

When a surface of the above-mentioned protective layer facing the adhesive layer has been subjected to a surface activation treatment, adhesive force between the protective layer and the adhesive layer can be improved. Accordingly, both can be prevented from being peeled in production steps of a semiconductor device and at the time of use as a product after the production, and a semiconductor device having high reliability can be produced.

The above-mentioned surface activation treatment is preferably at least one treatment selected from the group consisting of a plasma treatment, an ozone water treatment, an ultraviolet ozone treatment and an ion beam treatment. By these treatments, surface activation can be efficiently performed, even when the protective layer is composed of any one of the heat-resistant resins and the metals.

The present invention further provides a dicing tape-integrated film for semiconductor back surface, which comprises: a dicing tape comprising a base material and a pressure-sensitive adhesive layer laminated on the base material, and the above-mentioned film for flip chip type semiconductor back surface, which is laminated on the pressure-sensitive adhesive layer so that the protective layer faces the pressure-sensitive adhesive layer.

In the dicing tape-integrated film for semiconductor back surface having the above-mentioned constitution, the dicing tape and the film for flip chip type semiconductor back surface are integrally formed. Accordingly, the dicing tape-integrated film of this type can be used in a dicing step of dicing a semiconductor wafer to produce a semiconductor element, and also in a subsequent picking up step. That is to say, in the case where the dicing tape is attached to a back surface of the semiconductor wafer prior to the dicing step, the above-mentioned film for semiconductor back surface can also be attached thereto, so that a step of attaching only the film for semiconductor back surface thereto (a semiconductor back surface film attaching step) is not required. As a result, the number of process steps may be reduced. Moreover, the back surface of the semiconductor wafer or the semiconductor element formed by dicing is protected by the film for semiconductor back surface with the adhesive layer. Accordingly, in the dicing step and subsequent steps (such as the picking up step), damage of the semiconductor element can be reduced or prevented, and the occurrence of the flux-derived stains at flip chip bonding can be prevented, thereby being able to produce a semiconductor device having excellent appearance properties.

The present invention furthermore provides a method for producing a semiconductor device, the method comprising: attaching a semiconductor wafer onto the film for flip chip type semiconductor back surface in the above-mentioned dicing tape-integrated film for semiconductor back surface, dicing the semiconductor wafer to form a semiconductor element, peeling the semiconductor element together with the film for flip chip type semiconductor back surface from the pressure-sensitive adhesive layer of the dicing tape, adhering a flux to a connecting member for an adherend in the semiconductor element, and flip chip-connecting the semiconductor element onto the adherend.

In the production method, the film for flip chip type semiconductor back surface on which the protective layer is formed is used, so that the occurrence of the flux-derived stains on the film for semiconductor back surface can be prevented in the flip chip bonding step, and the semiconductor device having excellent appearance properties can be efficiently produced.

DESCRIPTION OF REFERENCE NUMERALS AND SIGNS

Figure 1:
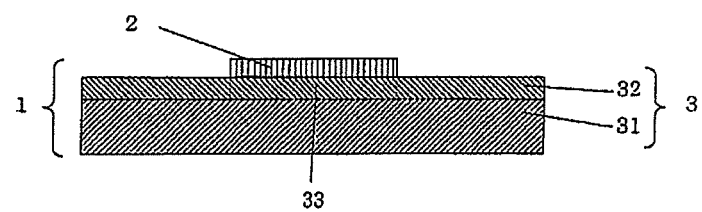
FIG. 1 is a cross-sectional schematic view showing one embodiment of a dicing tape-integrated film for semiconductor back surface of the invention.

1 Dicing Tape-Integrated Film for Semiconductor Back Surface
2 Film for Semiconductor Back Surface
21 Adhesive Layer
22 Protective Layer
3 Dicing Tape
31 Base Material
32 Pressure-Sensitive Adhesive Layer
33 Part Corresponding to Semiconductor Wafer-Attaching Part
4 Semiconductor Wafer
5 Semiconductor Chip
51 Bump Formed on the Circuit Face Side of Semiconductor Chip 5
6 Adherend
61 Conductive Material for Connection Adhered to Connection Pad of Adherend 6

BEST MODE FOR CARRYING OUT THE INVENTION

Embodiments of the invention will be described with reference to the drawings, but the invention is not restricted to these embodiments. Incidentally, in the drawings in the present specification, parts that are unnecessary for the description are omitted, and there are parts shown by magnifying, minifying or the like in order to make the description easy.

(Dicing Tape-Integrated Film for Semiconductor Back Surface)

FIG. 1 is a cross-sectional schematic view showing one embodiment of a dicing tape-integrated film for semiconductor back surface according to the invention. As shown in FIG. 1, the dicing tape-integrated film 1 for semiconductor back surface (hereinafter sometimes also referred to as "dicing tape-integrated semiconductor back surface protective film", "film for semiconductor back surface with dicing tape", or "semiconductor back surface protective film with dicing tape") comprises a dicing tape 3 including a pressure-sensitive adhesive layer 32 formed on a base material 31, and a film 2 for flip chip type semiconductor back surface (hereinafter sometimes referred to as "film for back surface", "film for semiconductor back surface" or "semiconductor back surface protective film") provided on the pressure-sensitive adhesive layer. As described later, the film 2 for semiconductor back surface includes an adhesive layer and a protective layer laminated on this adhesive layer.

Also, as shown in FIG. 1, the dicing tape-integrated film for semiconductor back surface of the invention may be so designed that the film 2 for semiconductor back surface is formed only on the part 33 corresponding to the semiconductor wafer-attaching part; however, the film for semiconductor back surface may be formed over the whole surface of the pressure-sensitive adhesive layer 32, or the film for semiconductor back surface may be formed on the part larger than the part 33 corresponding to the semiconductor wafer-attaching part but smaller than the whole surface of the pressure-sensitive adhesive layer 32. Incidentally, the surface of the film 2 for semiconductor back surface (surface to be attached to the back surface of wafer) may be protected with a separator or the like until the film is attached to wafer back surface. The followings sequentially describes the film for semiconductor back surface and the dicing tape-integrated film for semiconductor back surface in detail.

(Film for Flip Chip Type Semiconductor Back Surface)

Figure 2:
FIG. 2 is a cross-sectional schematic view showing one embodiment of a film for flip chip type semiconductor back surface of the invention.

FIG. 2 is a cross-sectional schematic view showing one embodiment of a film for flip chip type semiconductor back surface of the invention. The film 2 for flip chip type semiconductor back surface has a film-shaped configuration, and includes an adhesive layer 21 and a protective layer 22 laminated on the adhesive layer 21. The adhesive layer 21 is usually in an uncured state (including a semi-cured state) in the shape of the dicing tape-integrated film for semiconductor back surface as a product, and is thermally cured after the dicing tape-integrated film for semiconductor back surface is attached to the semiconductor wafer.

Moreover, the light transmittance with a visible light (visible light transmittance, wavelength: 400 to 800 nm) in the film 2 for semiconductor back surface is not particularly restricted but is, for example, preferably in the range of 20% or less (0 to 20%), more preferably 10% or less (0 to 10%), and particularly preferably 5% or less (0 to 5%). When the film 2 for semiconductor back surface has a visible light transmittance of more than 20%, there is a concern that the transmission of the light may adversely influence the semiconductor element. The visible light transmittance (%) can be controlled by the kind and content of the resin components of the film 2 for semiconductor back surface, the kind and content of the coloring agent (such as pigment or dye), the content of the inorganic filer, and the like.

The visible light transmittance (%) of the film 2 for semiconductor back surface can be determined as follows. Namely, a film 2 for semiconductor back surface having a thickness (average thickness) of 20 μm itself is prepared. Then, the film 2 for semiconductor back surface is irradiated with a visible light having a wavelength of 400 to 800 nm in a prescribed intensity [apparatus: a visible light generating apparatus manufactured by Shimadzu Corporation [trade name "ABSORPTION SPECTRO PHOTOMETER"], and the intensity of transmitted visible light is measured. Further, the visible light transmittance (%) can be determined based on intensity change before and after the transmittance of the visible light through the film 2 for semiconductor back surface. In this regard, it is also possible to derive visible light transmittance (%; wavelength: 400 to 800 nm) of the film 2 for semiconductor back surface having a thickness of 20 μm from the value of the visible light transmittance (%; wavelength: 400 to 800 nm) of the film 2 for semiconductor back surface whose thickness is not 20 μm. In the invention, the visible light transmittance (%) is determined in the case of the film 2 for semiconductor back surface having a thickness of 20 μm, but the film for semiconductor back surface according to the invention is not limited to one having a thickness of 20 μm.

(Adhesive Layer)

The adhesive layer 21 is preferably formed of at least a thermosetting resin, and more preferably formed of at least a thermosetting resin and a thermoplastic resin. Further, a thermal curing-accelerating catalyst may be allowed to be contained in the resin constituting the adhesive layer 21. The adhesive layer is formed of at least the thermosetting resin, thereby being able to effectively exhibit an adhesive function thereof.

Examples of the thermoplastic resin include natural rubber, butyl rubber, isoprene rubber, chloroprene rubber, an ethylene-vinyl acetate copolymer, an ethylene-acrylic acid copolymer, an ethylene-acrylic acid ester copolymer, a polybutadiene resin, a polycarbonate resin, a thermoplastic polyimide resin, a polyamide resin such as 6-nylon and 6,6-nylon, a phenoxy resin, an acrylic resin, a saturated polyester resin such as PET (polyethylene terephthalate) or PBT (polybutylene terephthalate), a polyamideimide resin, or a fluorine resin. The thermoplastic resin may be employed singly or in a combination of two or more kinds. Among these thermoplastic resins, an acrylic resin containing a small amount of ionic impurities, having high heat resistance and capable of securing reliability of a semiconductor element is especially preferable.

The acrylic resins are not particularly restricted, and examples thereof include polymers containing one kind or two or more kinds of esters of acrylic acid or methacrylic acid having a straight chain or branched alkyl group having 30 or less carbon atoms, preferably 4 to 18 carbon atoms, more preferably 6 to 10 carbon atoms, and especially 8 or 9 carbon atoms as component(s). Namely, in the invention, the acrylic resin has a broad meaning also including a methacrylic resin. Examples of the alkyl group include a methyl group, an ethyl group, a propyl group, an isopropyl group, an n-butyl group, a t-butyl group, an isobutyl group, a pentyl group, an isopentyl group, a hexyl group, a heptyl group, a 2-ethylhexyl group, an octyl group, an isooctyl group, a nonyl group, an isononyl group, a decyl group, an isodecyl group, an undecyl group, a dodecyl group (lauryl group), a tridecyl group, a tetradecyl group, a stearyl group, and an octadecyl group.

Moreover, other monomers for forming the acrylic resins (monomers other than the alkyl esters of acrylic acid or methacrylic acid in which the alkyl group is one having 30 or less carbon atoms) are not particularly restricted, and examples thereof include carboxyl group-containing monomers such as acrylic acid, methacrylic acid, carboxyethyl acrylate, carboxylpentyl acrylate, itaconic acid, maleic acid, fumaric acid, and crotonic acid; acid anhydride monomers such as maleic anhydride and itaconic anhydride; hydroxyl group-containing monomers such as 2-hydroxyethyl(meth) acrylate, 2-hydroxypropyl(meth)acrylate, 4-hydroxybutyl (meth)acrylate, 6-hydroxyhexyl(meth)acrylate, 8-hydroxyoctyl(meth)acrylate, 10-hydroxydecyl(meth)acrylate, 12-hydroxylauryl(meth)acrylate, and (4-hydroxymethylcyclohexyl)-methylacrylate; sulfonic acid group-containing monomers such as styrenesulfonic acid, allylsulfonic acid, 2-(meth)acrylamido-2-methylpropanesulfonic acid, (meth) acrylamidopropanesulfonic acid, sulfopropyl(meth)acrylate, and (meth)acryloyloxynaphthalenesulfonic acid; and phosphoric acid group-containing monomers such as 2-hydroxyethylacryloyl phosphate. In this regard, the (meth)acrylic acid means acrylic acid and/or methacrylic acid, (meth) acrylate means acrylate and/or methacrylate, (meth)acryl means acryl and/or methacryl, etc., which shall be applied over the whole specification.

Moreover, examples of the thermosetting resin include, in addition to an epoxy resin and a phenol resin, an amino resin, an unsaturated polyester resin, a polyurethane resin, a silicone resin and a thermosetting polyimide resin. The thermosetting resin may be employed singly or in a combination of two or more kinds. As the thermosetting resin, an epoxy resin containing only a small amount of ionic impurities which corrode a semiconductor element is suitable. Also, the phenol resin is suitably used as a curing agent of the epoxy resins.

The epoxy resin is not particularly restricted and, for example, a difunctional epoxy resin or a polyfunctional epoxy resin such as a bisphenol A type epoxy resin, a bisphenol F type epoxy resin, a bisphenol S type epoxy resin, a brominated bisphenol A type epoxy resin, a hydrogenated bisphenol A type epoxy resin, a bisphenol AF type epoxy resin, a biphenyl type epoxy resin, a naphthalene type epoxy resin, a fluorene type epoxy resin, a phenol novolak type epoxy resin, an o-cresol novolak type epoxy resin, a trishydroxyphenylmethane type epoxy resin and a tetraphenylolethane type epoxy resin, or an epoxy resin such as a hydantoin type epoxy resin, a trisglycidylisocyanurate type epoxy resin or a glycidylamine type epoxy resin may be used.

As the epoxy resin, among those exemplified above, a novolak type epoxy resin, a biphenyl type epoxy resin, a trishydroxyphenylmethane type epoxy resin, and a tetraphenylolethane type epoxy resin are preferable. This is because these epoxy resins have high reactivity with a phenol resin as a curing agent and are superior in heat resistance and the like.

Furthermore, the above-mentioned phenol resin acts as a curing agent of the epoxy resin, and examples thereof include novolak type phenol resins such as phenol novolak resins, phenol aralkyl resins, cresol novolak resins, tert-butylphenol novolak resins, and nonylphenol novolak resins; resol type phenol resins; and polyoxystyrenes such as poly-p-oxystyrene. The phenol resin may be employed singly or in a combination of two or more kinds. Among these phenol resins, phenol novolak resins and phenol aralkyl resins are especially preferable. This is because connection reliability of the semiconductor device can be improved.

The mixing ratio of the epoxy resin to the phenol resin is preferably made, for example, such that the hydroxyl group in the phenol resin becomes 0.5 to 2.0 equivalents per equivalent of the epoxy group in the epoxy resin component. It is more preferably 0.8 to 1.2 equivalents. That is, when the mixing ratio becomes outside the range, a curing reaction does not proceed sufficiently, and the characteristics of the epoxy resin cured product tends to deteriorate.

The content of the above-mentioned thermosetting resin is preferably from 5% by weight to 90% by weight, more preferably from 10% by weight to 85% by weight, and still more preferably from 15% by weight to 80% by weight, based on all the resin components in the adhesive layer. The thermosetting shrinkage can be easily controlled to 2% by volume or more by adjusting the above-mentioned content to 5% by weight or more. Further, when an encapsulation resin is thermally cured, the adhesive layer can be fully thermally cured, and surely adhered and fixed to the back surface of the semiconductor element, which makes it possible to produce the flip chip type semiconductor device with no peeling. On the other hand, the warpage of a package (PKG: flip chip type semiconductor device) can be inhibited by adjusting the above-mentioned content to 90% by weight or less.

Not specifically defined, the thermal curing-accelerating catalyst for the epoxy resin and the phenol resin may be suitably selected from known thermal curing-accelerating catalysts. One or more thermal curing-accelerating catalysts may be used here either singly or as combined. As the thermal curing-accelerating catalyst, for example, an amine-based curing-accelerating catalyst, a phosphorus-based curing-accelerating catalyst, an imidazole-based curing-accelerating catalyst, a boron-based curing-accelerating catalyst, or a phosphorus-boron-based curing-accelerating catalyst can be used.

The adhesive layer 21 is particularly suitably formed of a resin composition containing an epoxy resin and a phenolic resin or a resin composition containing an epoxy resin, a phenolic resin, and an acrylic resin. Since these resins contain only a small amount of ionic impurities and have high heat resistance, reliability of semiconductor elements can be secured.

It is important that the adhesive layer 21 has adhesiveness (close adhesiveness) to the back surface (non-circuit-formed face) of semiconductor wafer. The adhesive layer 21 can be, for example, formed of a resin composition containing an epoxy resin as a thermosetting resin component. In case where the adhesive layer 21 is cured beforehand to some degree, at its preparation, it is preferable to add a polyfunctional compound capable of reacting with the functional group or the like at the molecular chain end of the polymer as a crosslinking agent. Thereby, adhesive characteristics under high temperature can be enhanced and improvement of the heat resistance of the film can be achieved.

The adhesive force of the adhesive layer 21 to semiconductor wafer (23° C., peeling angle of 180 degrees, peeling rate of 300 mm/min) is preferably within a range of from 0.5 N/20 mm to 15 N/20 mm, more preferably from 0.7 N/20 mm to 10 N/20 mm. When the adhesive force is at least 0.5 N/20 mm, then the film can be adhered to semiconductor wafer and semiconductor element with excellent adhesiveness and is free from film swelling or the like adhesion failure. In addition, in dicing of semiconductor wafer, the chips can be prevented from flying out. On the other hand, when the adhesive force is at most 15 N/20 mm, then it facilitates peeling from the dicing tape.

The crosslinking agent is not particularly restricted and known crosslinking agents can be used. Specifically, for example, not only isocyanate-based crosslinking agents, epoxy-based crosslinking agents, melamine-based crosslinking agents, and peroxide-based crosslinking agents but also urea-based crosslinking agents, metal alkoxide-based crosslinking agents, metal chelate-based crosslinking agents, metal salt-based crosslinking agents, carbodiimide-based crosslinking agents, oxazoline-based crosslinking agents, aziridine-based crosslinking agents, amine-based crosslinking agents, and the like may be mentioned. As the crosslinking agent, an isocyanate-based crosslinking agent or an epoxy-based crosslinking agent is suitable. The crosslinking agent may be employed singly or in a combination of two or more kinds.

Examples of the isocyanate-based crosslinking agents include lower aliphatic polyisocyanates such as 1,2-ethylene diisocyanate, 1,4-butylene diisocyanate, and 1,6-hexamethylene diisocyanate; alicyclic polyisocyanates such as cyclopentylene diisocyanate, cyclohexylene diisocyanate, isophorone diisocyanate, hydrogenated tolylene diisocyanate, and hydrogenated xylylene diisocyanate; and aromatic polyisocyanates such as 2,4-tolylene diisocyanate, 2,6-tolylene diisocyanate, 4,4'-diphenylmethane diisocyanate, and xylylene diisocyanate. In addition, a trimethylolpropane/tolylene diisocyanate trimer adduct [a trade name "COLONATE L" manufactured by Nippon Polyurethane Industry Co., Ltd.], a trimethylolpropane/hexamethylene diisocyanate trimer adduct [a trade name "COLONATE HL" manufactured by Nippon Polyurethane Industry Co., Ltd.], and the like are also used. Moreover, examples of the epoxy-based crosslinking agents include N,N,N',N'-tetraglycidyl-m-xylenediamine, diglycidylaniline, 1,3-bis(N,N-glycidylaminomethyl)cyclohexane, 1,6-hexanediol diglycidyl ether, neopentyl glycol diglycidyl ether, ethylene glycol diglycidyl ether, propylene glycol diglycidyl ether, polyethylene glycol diglycidyl ether, polypropylene glycol diglycidyl ether, sorbitol polyglycidyl ether, glycerol polyglycidyl ether, pentaerythritol polyglycidyl ether, polyglycerol polyglycidyl ether, sorbitan polyglycidyl ether, trimethylolpropnane polyglycidyl ether, adipic acid diglycidyl ester, o-phthalic acid diglycidyl ester, triglycidyl-tris(2-hydroxyethyl)isocyanurate, resorcin diglycidyl ether, and bisphenol-S-diglycidyl ether, and also epoxy-based resins having two or more epoxy groups in the molecule.

The amount of the crosslinking agent to be used is not particularly restricted and can be appropriately selected depending on the degree of the crosslinking. Specifically, it is preferable that the amount of the crosslinking agent to be used is usually 7 parts by weight or less (for example, 0.05 to 7 parts by weight) based on 100 parts by weight of the polymer component (particularly, a polymer having a functional group at the molecular chain end). When the amount of the crosslinking agent is larger than 7 parts by weight based on 100 parts by weight of the polymer component, the adhesive force is lowered, so that the case is not preferred. From the viewpoint of improving the cohesive force, the amount of the crosslinking agent is preferably 0.05 parts by weight or more based on 100 parts by weight of the polymer component.

In the invention, instead of the use of the crosslinking agent or together with the use of the crosslinking agent, it is also possible to perform a crosslinking treatment by irradiation with an electron beam, UV light, or the like.

The above-mentioned adhesive layer 21 may be colored. When the protective layer is transparent, the colored adhesive layer can exhibit excellent appearance properties through the protective layer, which makes it possible to obtain the semiconductor device having value-added appearance. The colored film for semiconductor back surface can also accentuate marking on the transparent protective layer, so that marking can be performed to impart various kinds of information such as literal information and graphical information to a face on the non-circuit side of the semiconductor element or the semiconductor device using the semiconductor element by utilizing any of various marking methods such as a printing method and a laser marking method, through the film for semiconductor back surface. In particular, by controlling the color of coloring, it becomes possible to visually observe the information (such as literal information and graphical information) imparted by marking with excellent visibility. Moreover, when the adhesive layer is colored, the dicing tape and the film for semiconductor back surface can be easily distinguished from each other, so that workability and the like can be improved. Furthermore, for example, as the semiconductor device, it is also possible to classify products thereof by color. In the case where the film for semiconductor back surface is colored (in the case where the film is neither colorless nor transparent), the color shown by coloring is not particularly restricted. However, for example, dark colors such as black, blue and red are preferred, and black is especially suitable.

In the present embodiment, dark color basically means a dark color having L*, defined in L*a*b* color space, of 60 or smaller (0 to 60), preferably 50 or smaller (0 to 50), and more preferably 40 or smaller (0 to 40).

Moreover, black color basically means a black-based color having L*, defined in L*a*b* color space, of 35 or smaller (0 to 35), preferably 30 or smaller (0 to 30), and more preferably 25 or smaller (0 to 25). In this regard, in the black color, each of a* and b*, defined in the L*a*b* color space, can be suitably selected according to the value of L*. For example, both of a* and b* are within the range of preferably −10 to 10, more preferably −5 to 5, and further preferably −3 to 3 (particularly 0 or about 0).

In the present embodiment, L*, a*, and b* defined in the L*a*b* color space can be determined by a measurement with a color difference meter (a trade name "CR-200" manufactured by Minolta Ltd; color difference meter). The L*a*b* color space is a color space recommended by the Commission Internationale de l'Eclairage (CIE) in 1976, and means a color space called CIE1976 (L*a*b*) color space. Also, the L*a*b* color space is defined in Japanese Industrial Standards in JIS Z8729.

At coloring of the adhesive layer 21, according to an objective color, a colorant (coloring agent) can be used. As such a colorant, various dark-colored colorants such as black-colored colorants, blue-colored colorants, and red-colored colorants can be suitably used and black-colored colorants are more suitable. The colorant may be any of pigments and dyes. The colorant may be employed singly or in combination of two or more kinds. In this regard, as the dyes, it is possible to use any forms of dyes such as acid dyes, reactive dyes, direct dyes, disperse dyes, and cationic dyes. Moreover, also with regard to the pigments, the form thereof is not particularly restricted and can be suitably selected and used among known pigments.

In particular, when a dye is used as a colorant, the dye becomes in a state that it is homogeneously or almost homogeneously dispersed by dissolution in the adhesive layer 21, so that the film for semiconductor back surface (as a result, the dicing tape-integrated film for semiconductor back surface) having a homogeneous or almost homogeneous color density can be easily produced. Accordingly, when a dye is used as a colorant, the film for semiconductor back surface in the dicing tape-integrated film for semiconductor back surface can have a homogeneous or almost homogeneous color density and can enhance a marking property and an appearance property.

The black-colored colorant is not particularly restricted and can be, for example, suitably selected from inorganic black-colored pigments and black-colored dyes. Moreover, the black-colored colorant may be a colorant mixture in which a cyan-colored colorant (blue-green colorant), a magenta-colored colorant (red-purple colorant), and a yellow-colored colorant (yellow colorant) are mixed. The black-colored colorant may be employed singly or in a combination of two or more kinds. Of course, the black-colored colorant may be used in combination with a colorant of a color other than black.

Specific examples of the black-colored colorant include carbon black (such as furnace black, channel black, acetylene black, thermal black, or lamp black), graphite, copper oxide, manganese dioxide, azo-type pigments (such as azomethine azo black), aniline black, perylene black, titanium black, cyanine black, active charcoal, ferrite (such as non-magnetic ferrite or magnetic ferrite), magnetite, chromium oxide, iron oxide, molybdenum disulfide, a chromium complex, a composite oxide type black pigment, and an anthraquinone type organic black pigment.

In the invention, as the black-colored colorant, black-colored dyes such as C.I. Solvent Black 3, 7, 22, 27, 29, 34, 43, 70, C.I. Direct Black 17, 19, 22, 32, 38, 51, 71, C.I. Acid Black 1, 2, 24, 26, 31, 48, 52, 107, 109, 110, 119, 154, and C.I. Disperse Black 1, 3, 10, 24; black-colored pigments such as C.I. Pigment Black 1, 7; and the like can also be utilized.

As such black-colored colorants, for example, a trade name "Oil Black BY", a trade name "Oil Black BS", a trade name "Oil Black HBB", a trade name "Oil Black 803", a trade name "Oil Black 860", a trade name "Oil Black 5970", a trade name "Oil Black 5906", a trade name "Oil Black 5905" (manufactured by Orient Chemical Industries Co., Ltd.), and the like are commercially available.

Examples of colorants other than the black-colored colorant include cyan-colored colorants, magenta-colored colorants, and yellow-colored colorants. Examples of the cyan-colored colorants include cyan-colored dyes such as C.I. Solvent Blue 25, 36, 60, 70, 93, 95; C.I. Acid Blue 6 and 45; cyan-colored pigments such as C.I. Pigment Blue 1, 2, 3, 15, 15:1, 15:2, 15:3, 15:4, 15:5, 15:6, 16, 17, 17:1, 18, 22, 25, 56, 60, 63, 65, 66; C.I. Vat Blue 4, 60; and C.I. Pigment Green 7.

Moreover, among the magenta colorants, examples of magenta-colored dye include C.I. Solvent Red 1, 3, 8, 23, 24, 25, 27, 30, 49, 52, 58, 63, 81, 82, 83, 84, 100, 109, 111, 121, 122; C.I. Disperse Red 9; C.I. Solvent Violet 8, 13, 14, 21, 27; C.I. Disperse Violet 1; C.I. Basic Red 1, 2, 9, 12, 13, 14, 15, 17, 18, 22, 23, 24, 27, 29, 32, 34, 35, 36, 37, 38, 39, 40; C.I. Basic Violet 1, 3, 7, 10, 14, 15, 21, 25, 26, 27 and 28.

Among the magenta-colored colorants, examples of magenta-colored pigment include C.I. Pigment Red 1, 2, 3, 4, 5, 6, 7, 8, 9, 10, 11, 12, 13, 14, 15, 16, 17, 18, 19, 21, 22, 23, 30, 31, 32, 37, 38, 39, 40, 41, 42, 48:1, 48:2, 48:3, 48:4, 49, 49:1, 50, 51, 52, 52:2, 53:1, 54, 55, 56, 57:1, 58, 60, 60:1, 63, 63:1, 63:2, 64, 64:1, 67, 68, 81, 83, 87, 88, 89, 90, 92, 101, 104, 105, 106, 108, 112, 114, 122, 123, 139, 144, 146, 147, 149, 150, 151, 163, 166, 168, 170, 171, 172, 175, 176, 177, 178, 179, 184, 185, 187, 190, 193, 202, 206, 207, 209, 219, 222, 224, 238, 245; C.I. Pigment Violet 3, 9, 19, 23, 31, 32, 33, 36, 38, 43, 50; C.I. Vat Red 1, 2, 10, 13, 15, 23, 29 and 35.

Moreover, examples of the yellow-colored colorants include yellow-colored dyes such as C.I. Solvent Yellow 19, 44, 77, 79, 81, 82, 93, 98, 103, 104, 112, and 162; yellow-colored pigments such as C.I. Pigment Orange 31, 43; C.I. Pigment Yellow 1, 2, 3, 4, 5, 6, 7, 10, 11, 12, 13, 14, 15, 16, 17, 23, 24, 34, 35, 37, 42, 53, 55, 65, 73, 74, 75, 81, 83, 93, 94, 95, 97, 98, 100, 101, 104, 108, 109, 110, 113, 114, 116, 117, 120, 128, 129, 133, 138, 139, 147, 150, 151, 153, 154, 155, 156, 167, 172, 173, 180, 185, 195; C.I. Vat Yellow 1, 3, and 20.

Various colorants such as cyan-colored colorants, magenta-colored colorants, and yellow-colorant colorants may be employed singly or in a combination of two or more kinds, respectively. In this regard, in the case where two or more kinds of various colorants such as cyan-colored colorants, magenta-colored colorants, and yellow-colorant colorants are used, the mixing ratio (or blending ratio) of these colorants is not particularly restricted and can be suitably selected according to the kind of each colorant, an objective color, and the like.

In the case where the adhesive layer 21 is colored, the colored form is not particularly restricted. The adhesive layer 21 may be, for example, a single-layer film-shaped article added with a coloring agent. Moreover, the adhesive layer 21 may be a laminated film where a resin layer formed of at least a thermosetting resin and a coloring agent layer are at least laminated. In this regard, in the case where the adhesive layer 21 is a laminated film of the resin layer and the coloring agent layer, the adhesive layer 21 in the laminated form preferably has a laminated form of a resin layer/a coloring agent layer/a resin layer. In this case, two resin layers at both sides of the coloring agent layer may be resin layers having the same composition or may be resin layers having different composition.

Into the adhesive layer 21, other additives can be suitably blended according to the necessity. Examples of the other additives include an extender, an antiaging agent, an antioxidant, and a surfactant, in addition to a filler, a flame retardant, a silane-coupling agent, and an ion-trapping agent.

The filler may be any of an inorganic filler and an organic filler, but is preferably an inorganic filler. Incorporating the other filler such as an inorganic filler thereinto makes it possible to impart electroconductivity to the adhesive layer 21, to enhance the thermal conductivity of the adhesive layer 21 and to control the elasticity of the adhesive layer 21. The adhesive layer 21 may be electroconductive or non-electroconductive. The inorganic filler includes various inorganic powders of, for example, ceramics such as silica, clay, gypsum, calcium carbonate, barium sulfate, beryllium oxide; metals such as aluminium, copper, silver, gold, nickel, chromium, lead, tin, zinc, palladium, solder; their alloys and other carbon. One or more such fillers may be used here either singly or as combined. As the filler, preferred is silica, and more preferred is fused silica. Preferably, the average particle size of the inorganic filler is within a range of from 0.1 μm to 80 μm. The average particle size of the inorganic filler is determined with a laser diffraction particle sizer.

The blending amount of the filler (in particular, inorganic filler) is preferably 80 parts by weight or less (0 part by weight to 80 parts by weight) and more preferably 0 part by weight to 70 parts by weight based on 100 parts by weight of the organic resin components.

Examples of the flame retardant include antimony trioxide, antimony pentoxide, and brominated epoxy resins. The flame retardant may be employed singly or in a combination of two or more kinds. Examples of the silane coupling agent include β-(3,4-epoxycyclohexyl)ethyltrimethoxysilane, γ-glycidoxypropyltrimethoxysilane, and γ-glycidoxypropylmethyldiethoxysilane. The silane coupling agent may be employed singly or in a combination of two or more kinds. Examples of the ion-trapping agent include hydrotalcites and bismuth hydroxide. The ion-trapping agent may be employed singly or in a combination of two or more kinds.

Incidentally, in the case where the adhesive layer 21 is formed of a resin composition containing a thermosetting resin such as an epoxy resin, the adhesive layer 21 is in a state that the thermosetting resin is uncured or partially cured at a stage before the film is applied to a semiconductor wafer. In this case, after it is applied to the semiconductor wafer (specifically, usually, at the time when the encapsulating material is cured in the flip chip bonding step), the thermosetting resin in the adhesive layer 21 is completely or almost completely cured.

As above, since the adhesive layer 21 is in a state that the thermosetting resin is uncured or partially cured even when the film contains the thermosetting resin, the gel fraction of the adhesive layer 21 is not particularly restricted but is, for example, suitably selected from the range of 50% by weight or less (0 to 50% by weight) and is preferably 30% by weight or less (0 to 30% by weight) and particularly preferably 10% by weight or less (0 to 10% by weight). The gel fraction of the adhesive layer 21 can be measured by the following measuring method.

<Gel Fraction Measuring Method>

About 0.1 g of a sample is sampled from the adhesive layer 21 and precisely weighed (weight of sample) and, after the sample is wrapped in a mesh-type sheet, it is immersed in about 50 mL of toluene at room temperature for 1 week. Thereafter, a solvent-insoluble matter (content in the mesh-type sheet) is taken out of the toluene and dried at 130° C.

for about 2 hours, the solvent-insoluble matter after drying is weighed (weight after immersion and drying), and a gel fraction (% by weight) is then calculated according to the following expression (a).

Gel fraction (% by weight)=[(Weight after immersion and Drying)/(Weight of sample)]×100     (a)

The gel fraction of the adhesive layer 21 can be controlled by the kind and content of the resin components and the kind and content of the crosslinking agent and besides, heating temperature, heating time and the like.

In the invention, in the case where the adhesive layer 21 is a film-shaped article formed of a resin composition containing a thermosetting resin such as an epoxy resin, close adhesiveness to a semiconductor wafer can be effectively exhibited.

Incidentally, since cutting water is used in the dicing step of the semiconductor wafer, the adhesive layer 21 absorbs moisture to have a moisture content of a normal state or more in some cases. When flip chip bonding is performed with still maintaining such a high moisture content, water vapor remains at the adhesion interface between the adhesive layer 21 and the semiconductor wafer or its processed body (semiconductor) and lifting is generated in some cases. Therefore, by constituting the adhesive layer 21 as a configuration in which a core material having a high moisture permeability is provided on each surface thereof, water vapor diffuses and thus it becomes possible to avoid such a problem. From such a viewpoint, a multilayered structure in which the adhesive layer is formed at one surface or both surfaces of the core material may be used as the adhesive layer 21. Examples of the core material include films (e.g., polyimide films, polyester films, polyethylene terephthalate films, polyethylene naphthalate films, polycarbonate films, etc.), resin substrates reinforced with a glass fiber or a plastic nonwoven fiber, silicon substrates, and glass substrates.

The thickness (total thickness in the case of the laminated film) of the adhesive layer 21 is not particularly restricted but can be, for example, suitably selected from the range of about 2 μm to 200 μm. Furthermore, the thickness is preferably about 3 μm to 160 μm, more preferably about 4 μm to 100 μm, and particularly about 5 μm to 80 μm.

The tensile storage elastic modulus of the above-mentioned adhesive layer 21 in an uncured state at 23° C. is preferably 1 GPa or more (for example, 1 GPa to 50 GPa), more preferably 2 GPa or more, and particularly preferably 3 GPa or more. Incidentally, in the case where the adhesive layer 21 is formed of the resin composition containing the thermosetting resin, the thermosetting resin is usually in an uncured or partially cured state, as described above. Accordingly, the elastic modulus of the adhesive layer 21 at 23° C. is usually the tensile storage elastic modulus at 23° C. in a state where the thermosetting resin is uncured or partially cured.

Here, the adhesive layer 21 may be either a single layer or a laminated film where a plurality of layers are laminated. In the case of the laminated film, the tensile storage elastic modulus is sufficiently 1 GPa or more (e.g., 1 GPa to 50 GPa) as the whole laminated film in an uncured state. Also the tensile storage elastic modulus (23° C.) of the adhesive layer in an uncured state can be controlled by suitably setting up the kind and content of the resin components (thermoplastic resin and/or thermosetting resin) or the kind and content of a filler such as a silica filler. In the case where the adhesive layer 21 is a laminated film where a plurality of layers are laminated (in the case where the adhesive layer has a form of the laminated layer), as the lamination form, is not particularly limited. Moreover, between the adhesive layer and the protective layer, other layers (an intermediate layer, a light-shielding layer, a reinforcing layer, a colored layer, a base material layer, an electromagnetic wave-shielding layer, a heat conductive layer, a pressure-sensitive adhesive layer, etc.) may be provided.

The tensile storage elastic modulus is determined by preparing the film-shaped adhesive layer 21 in an uncured state without lamination onto the dicing tape 3 and measuring elastic modulus in a tensile mode under conditions of a sample width of 10 mm, a sample length of 22.5 mm, a sample thickness of 0.2 mm, a frequency of 1 Hz, and a temperature elevating rate of 10° C./minute under a nitrogen atmosphere at a prescribed temperature (23° C.) using a dynamic viscoelasticity measuring apparatus "Solid Analyzer RS A2" manufactured by Rheometrics Co. Ltd. and the measured elastic modulus is regarded as a value of tensile storage elastic modulus obtained.

Preferably, the surface of the adhesive layer which is opposite to the surface thereof that faces the protective layer is protected with a separator (release liner) (not shown in figures). The separator has a function as a protective material for protecting the adhesive layer until it is practically used. Further, in the dicing tape-integrated film 1 for semiconductor back surface, the separator may further serve as the supporting base material in transferring the film 2 for semiconductor back surface onto the pressure-sensitive adhesive layer 32 of the base material of the dicing tape. The separator is peeled off when a semiconductor wafer is attached onto the film for semiconductor back surface. As the separator, a film of polyethylene or polypropylene, as well as a plastic film (such as polyethylene terephthalate), a paper or the like whose surface is coated with a releasing agent such as a fluorine-based releasing agent or a long-chain alkyl acrylate-based releasing agent can also be used. The separator can be formed by a conventionally known method. Moreover, the thickness or the like of the separator is not particularly restricted.

In case where the film for semiconductor back surface 2 is not laminated with the dicing tape 3, the adhesive layer 21 may be wound up along with one separator having a release layer on both sides thereof, into a roll in which it is protected with the separator having a release layer on both surfaces thereof; or it may be protected with a separator having a release layer on at least one surface thereof.

Moreover, as the adhesive layer 21, one having lower moisture absorbance is more preferred. Specifically, the moisture absorbance is preferably 1% by weight or less and more preferably 0.8% by weight or less. By regulating the moisture absorbance to 1% by weight or less, the generation of voids between the adhesive layer 21 and the semiconductor element can be suppressed or prevented in the reflow step. The moisture absorbance is a value calculated from a weight change before and after the adhesive layer 21 is allowed to stand under an atmosphere of a temperature of 85° C. and a humidity of 85% RH for 168 hours. In the case where the adhesive layer 21 is formed of a resin composition containing a thermosetting resin, the moisture absorbance means a value obtained when the film after thermal curing is allowed to stand under an atmosphere of a temperature of 85° C. and a humidity of 85% RH for 168 hours. Moreover, the moisture absorbance can be regulated, for example, by changing the amount of the inorganic filler to be added.

Moreover, as the adhesive layer 21, one having a smaller ratio of volatile matter is more preferred. Specifically, the ratio of weight decrease (weight decrease ratio) of the adhesive layer 21 after heating treatment is preferably 1% by weight or less and more preferably 0.8% by weight or less. The conditions for the heating treatment are, for example, a heating temperature of 250° C. and a heating time of 1 hour. By regulating the weight decrease ratio to 1% by weight or less, for example, the generation of cracks in a flip chip type semiconductor device can be suppressed or prevented in the reflow step. The weight decrease ratio can be regulated, for example, by adding an inorganic substance capable of reducing the crack generation at lead-free solder reflow. In the case where the adhesive layer 21 is formed of a resin composition containing a thermosetting resin component, the weight decrease ratio is a value obtained when the adhesive layer 21 after thermal curing is heated under conditions of a temperature of 250° C. and a heating time of 1 hour.

(Protective Layer)

The above-mentioned protective layer 22 is laminated on the adhesive layer 21 in a film form, and is composed of the heat-resistant resin having a glass transition temperature of 200° C. or more or the metal. In the film for flip chip type semiconductor back surface, the protective layer is provided as described above, so that the occurrence of the flux-derived stains at flip chip bonding can be prevented.

The heat-resistant resin constituting the protective layer 22 is not particularly restricted, as long as the heat-resistant resin has a glass transition temperature of 200° C. or more, and resins so-called super engineering plastics can be suitably used. Examples thereof include polyphenylene sulfides (PPS), polyimides (PI), polyether imides (PEI), polyarylates (PAR), polysulfones (PSF), polyether sulfones (PES), polyether ether ketones (PEEK), liquid crystal polymers (LCP), polytetrafluoroethylene (PTFE) and the like. Of these, at least one selected from the group consisting of polyimides, polyphenylene sulfides, polysulfones, polyether imides, polyether ketones and polyether ether ketones is preferred, and polyimides are particularly preferred, from the viewpoints of easy availability and the prevention of the occurrence of the flux-derived stains. Herein, the glass transition temperature (Tg) of the heat-resistant resin can be determined as follows. The tensile storage elastic modulus and the tensile loss elastic modulus of the heat-resistant resin are determined by preparing a sample of the heat-resistant resin and measuring the storage elastic modulus and the loss elastic modulus in a tensile mode under conditions of a sample width of 10 mm, a sample length of 22.5 mm, a sample thickness of 0.2 mm, a frequency of 1 Hz, and a temperature elevating rate of 10° C./minute under a nitrogen atmosphere at a prescribed temperature (23° C.) using a dynamic viscoelasticity measuring apparatus "Solid Analyzer RS A2" manufactured by Rheometrics Co. Ltd. Then, tan δ=(loss elastic modulus)/(storage elastic modulus) was calculated using the obtained values of the tensile storage elastic modulus and the tensile loss elastic modulus and regarded as the glass transition temperature (Tg) of the heat-resistant resin.

The metal constituting the protective layer 22 is not particularly restricted. For example, at least one selected from the group consisting of aluminum, alumite, stainless steel, iron, titanium, tin and copper is preferred in terms of laser marking properties. Of these, aluminum is particularly preferred in consideration of easy processing, laser marking properties and the like.

The thickness of the protective layer 22 can be appropriately determined in consideration of processability and the like. The thickness thereof is usually within the range of 2 to 200 μm, preferably from 3 to 100 μm, more preferably from 4 to 80 μm, and particularly preferably from 5 to 50 μm.

When the protective layer 22 is composed of the heat-resistant resin, the protective layer 22 may be colored. Further, when the protective layer 22 is composed of the metal, a coloring layer may be provided on a surface of the protective layer 22. As methods for coloring the protective layer 22, the above-mentioned methods for coloring the adhesive layer can be suitably employed.

(Method for Producing Film for Flip Chip Type Semiconductor Back Surface)

First, the adhesive layer 21 can be formed, for example, by utilizing a conventional method of mixing the thermosetting resin such as an epoxy resin, the thermoplastic resin such as an acrylic resin as needed, and a solvent, other additives and the like as needed to prepare a resin composition, and forming the composition to a film-shaped layer. Specific examples thereof include a method including applying the above-mentioned resin composition onto an appropriate separator (such as release paper), and drying the composition (heat treating as needed and drying the composition, in the case where thermal curing is required) to form the adhesive layer. Further, when the adhesive layer is directly formed on the pressure-sensitive adhesive layer of the dicing tape, the film-shaped adhesive layer can be formed by a method of applying the above-mentioned resin composition onto the pressure-sensitive adhesive layer 32 of the dicing tape, a method of transferring the adhesive layer formed on the separator onto the pressure-sensitive adhesive layer 32, or the like. The above-mentioned resin composition may be either a solution or a dispersion. Incidentally, when thermal curing is performed in forming the film 2 for semiconductor back surface, it is important to perform thermal curing to such a degree that a partially cured state is obtained. However, it is preferred to perform no thermal curing.

Then, the film for flip chip type semiconductor back surface can be prepared by attaching the resulting adhesive layer to the protective layer separately prepared. As the protective layer, a commercially available heat-resistant resin or metal foil is satisfactorily used. Further, for example, when a polyimide film is employed as the protective layer, the polyimide film can be formed by applying a solution of polyamic acid to a heat-resistant supporting base material and performing imidation at about 300 to 500° C. Furthermore, in the case of the metal protective layer, a thin metal film may be directly formed by performing sputtering or the like on the adhesive layer. Attaching conditions of the adhesive layer and the protective layer are not particularly restricted, and examples thereof include conditions of an attaching angle of 100 to 140°, a pressure of 0.1 to 0.5 MPa and a speed of 5 to 20 mm/s.

(Dicing Tape)

The dicing tape 3 includes a base material 31 and a pressure-sensitive adhesive layer 32 formed on the base material 31. Thus, it is sufficient that the dicing tape 3 has a configuration in which the base material 31 and the pressure-sensitive adhesive layer 32 are laminated.

(Base Material)

The base material (supporting base material) can be used as a supporting material for the pressure-sensitive adhesive layer and the like. The base material 31 preferably has a radiation ray-transmitting property. As the base material 31, for example, suitable thin materials, e.g., paper-based base materials such as paper; fiber-based base materials such as fabrics, non-woven fabrics, felts, and nets; metal-based base materials such as metal foils and metal plates; plastic base materials such as plastic films and sheets; rubber-based base materials such as rubber sheets; foamed bodies such as foamed sheets; and laminates thereof [particularly, laminates of plastic based materials with other base materials, laminates of plastic films (or sheets) each other, etc.] can be used. In the invention, as the base material, plastic base materials such as plastic films and sheets can be suitably employed. Examples of raw materials for such plastic materials include olefinic resins such as polyethylene (PE), polypropylene (PP), and ethylene-propylene copolymers; copolymers using ethylene as a monomer component, such as ethylene-vinyl acetate copolymers (EVA), ionomer resins, ethylene-(meth) acrylic acid copolymers, and ethylene-(meth)acrylic acid ester (random, alternating) copolymers; polyesters such as polyethylene terephthalate (PET), polyethylene naphthalate (PEN), and polybutylene terephthalate (PBT); acrylic resins; polyvinyl chloride (PVC); polyurethanes; polycarbonates; polyphenylene sulfide (PPS); amide-based resins such as polyamides (Nylon) and whole aromatic polyamides (aramide); polyether ether ketones (PEEK); polyimides; polyetherimides; polyvinylidene chloride; ABS (acrylonitrile-butadiene-styrene copolymers); cellulose-based resins; silicone resins; and fluorinated resins.

In addition, the materials for the base material 31 include polymers such as crosslinked materials of the foregoing resins. The plastic films may be used without stretching or may be used after subjected to a uniaxial or biaxial stretching treatment, if necessary. According to the resin sheet to which thermal contraction property is imparted by a stretching treatment or the like, the adhered area between the pressure-sensitive adhesive layer 32 and the film for semiconductor back surface 2 is reduced by thermal contraction of the base material 31 after dicing and thus the recovery of the semiconductor chip can be facilitated.

A commonly used surface treatment, e.g., a chemical or physical treatment such as a chromate treatment, ozone exposure, flame exposure, exposure to high-voltage electric shock, or an ionized radiation treatment, or a coating treatment with an undercoating agent e.g., a pressure-sensitive adhesive substance to be mentioned later) may be applied onto the surface of the base material 31 in order to enhance close adhesiveness with the adjacent layer, holding properties, and the like.

As the base material 31, the same kind or different kinds of materials can be suitably selected and used and, if necessary, several kinds of materials can be blended and used. Moreover, to the base material 31, for imparting antistatic ability, a vapor deposition layer of a conductive substance having a thickness of about 30 to 500 angstrom, which is composed of a metal, alloy or an oxide thereof, can be formed on the base material 31. The base material 31 may be a single layer or a multilayer of two or more thereof.

The thickness (total thickness in the case of the laminated layer) of the base material 31 is not particularly restricted and can be appropriately selected depending on strength, flexibility, intended purpose of use, and the like. For example, the thickness is generally 1,000 μm or less (e.g., 1 μm to 1,000 μm), preferably 10 μm to 500 μm, further preferably 20 μm to 300 μm, and particularly preferably about 30 μm to 200 μm but is not limited thereto.

Incidentally, the base material 31 may contain various additives (a coloring agent, a filler, a plasticizer, an antiaging agent, an antioxidant, a surfactant, a flame retardant, etc.) within the range where the advantages and the like of the invention are not impaired.

(Pressure-Sensitive Adhesive Layer)

The pressure-sensitive adhesive layer 32 is formed of a pressure-sensitive adhesive and has a pressure-sensitive adhesiveness. Not specifically defined, the pressure-sensitive adhesive may be suitably selected from known pressure-sensitive adhesives. Concretely, as the pressure-sensitive adhesive, for example, those having the above-mentioned characteristics are suitably selected from known pressure-sensitive adhesives such as acrylic pressure-sensitive adhesives, rubber-based pressure-sensitive adhesives, vinyl alkyl ether-based pressure-sensitive adhesives, silicone-based pressure-sensitive adhesives, polyester-based pressure-sensitive adhesives, polyamide-based pressure-sensitive adhesives, urethane-based pressure-sensitive adhesives, fluorine-based pressure-sensitive adhesives, styrene-diene block copolymer-based pressure-sensitive adhesives, and creep characteristics-improved pressure-sensitive adhesives prepared by incorporating a thermofusible resin having a melting point of not higher than 200° C. to the above-mentioned pressure-sensitive adhesive (for example, see JP-A 56-61468, JP-A-61-174857, JP-A-63-17981, JP-A-56-13040, herein incorporated by reference), and are used herein. As the pressure-sensitive adhesive, also usable here are radiation-curable pressure-sensitive adhesives (or energy ray-curable pressure-sensitive adhesives) and thermally expandable pressure-sensitive adhesives. One or more such pressure-sensitive adhesives may be used here either singly or as combined.

As the pressure-sensitive adhesive, preferred for use herein are acrylic pressure-sensitive adhesives and rubber-based pressure-sensitive adhesives, and more preferred are acrylic pressure-sensitive adhesives. The acrylic pressure-sensitive adhesives include those comprising, as the base polymer, an acrylic polymer (homopolymer or copolymer) of one or more alkyl(meth)acrylates as monomer component(s).

The alkyl(meth)acrylate for the acrylic pressure-sensitive adhesive includes, for example, methyl (meth)acrylate, ethyl (meth)acrylate, propyl(meth)acrylate, isopropyl(meth)acrylate, butyl (meth)acrylate, isobutyl(meth)acrylate, s-butyl (meth)acrylate, t-butyl (meth)acrylate, pentyl(meth)acrylate, hexyl(meth)acrylate, heptyl(meth)acrylate, octyl(meth)acrylate, 2-ethylhexyl(meth)acrylate, isooctyl(meth)acrylate, nonyl(meth)acrylate, isononyl(meth)acrylate, decyl(meth) acrylate, isodecyl(meth)acrylate, undecyl(meth)acrylate, dodecyl(meth)acrylate, tridecyl(meth)acrylate, tetradecyl (meth)acrylate, pentadecyl(meth)acrylate, hexadecyl(meth) acrylate, heptadecyl(meth)acrylate, octadecyl(meth)acrylate, nonadecyl(meth)acrylate, eicosyl(meth)acrylate, etc. As the alkyl(meth)acrylate, preferred are those in which the alkyl group has from 4 to 18 carbon atoms. In the alkyl (meth)acrylate, the alkyl group may be linear or branched.

The acrylic polymer may contain, if desired, a unit corresponding to any other monomer component copolymerizable with the above-mentioned alkyl(meth)acrylate (copolymerizable monomer component), for the purpose of improving the cohesive force, the heat resistance and the crosslinkability thereof. The copolymerizable monomer component includes, for example, carboxyl group-containing monomers such as (meth)acrylic acid (acrylic acid, methacrylic acid), carboxyethyl acrylate, carboxypentyl acrylate, itaconic acid, maleic acid, fumaric acid, crotonic acid; acid anhydride group-containing monomers such as maleic anhydride, itaconic anhydride; hydroxyl group-containing monomers such as hydroxyethyl(meth)acrylate, hydroxypropyl(meth)acrylate, hydroxybutyl(meth)acrylate, hydroxyhexyl(meth)acrylate, hydroxyoctyl(meth)acrylate, hydroxydecyl(meth)acrylate, hydroxylauryl(meth)acrylate, (4-hydroxymethylcyclohexyl)methyl methacrylate; sulfonic acid group-containing monomers such as styrenesulfonic acid, allylsulfonic acid, 2-(meth)acrylamide-2-methylpropanesulfonic acid, (meth)acrylamide-propanesulfonic acid, sulfopropyl(meth)acrylate, (meth)acryloyloxynaphthalenesulfonic acid; phosphoric acid group-containing monomers such as 2-hydroxyethyl acryloylphosphate; (N-substituted) amide monomers such as (meth)acrylamide, N,N-dimethyl (meth)acrylamide, N-butyl(meth)acrylamide, N-methylol (meth)acrylamide, N-methylolpropane(meth)acrylamide; aminoalkyl(meth)acrylate monomers such as aminoethyl (meth)acrylate, N,N-dimethylaminoethyl(meth)acrylate, t-butylaminoethyl(meth)acrylate; alkoxyalkyl(meth)acrylate monomers such as methoxyethyl(meth)acrylate, ethoxyethyl(meth)acrylate; cyanoacrylate monomers such as acrylonitrile, methacrylonitrile; epoxy group-containing acrylic monomers such as glycidyl(meth)acrylate; styrene monomers such as styrene, α-methylstyrene; vinyl ester monomers such as vinyl acetate, vinyl propionate; olefin monomers such as isoprene, butadiene, isobutylene; vinyl ether monomers such as vinyl ether; nitrogen-containing monomers such as N-vinylpyrrolidone, methylvinylpyrrolidone, vinylpyridine, vinylpiperidone, vinylpyrimidine, vinylpiperazine, vinylpyrazine, vinylpyrrole, vinylimidazole, vinyloxazole, vinylmorpholine, N-vinylcarbonamides, N-vinylcaprolactam; maleimide monomers such as N-cyclohexylmaleimide, N-isopropylmaleimide, N-laurylmaleimide, N-phenylmaleimide; itaconimide monomers such as N-methylitaconimide, N-ethylitaconimide, N-butylitaconimide, N-octylitaconimide, N-2-ethylhexylitaconimide, N-cyclohexylitaconimide, N-laurylitaconimide; succinimide monomers such as N-(meth)acryloyloxymethylenesuccinimide, N-(meth)acryloyl-6-oxyhexamethylenesuccinimide, N-(meth)acryloyl-8-oxyoctamethylenesuccinimide; acryl glycolate monomers such as polyethylene glycol(meth)acrylate, polypropylene glycol(meth)acrylate, methoxyethylene glycol(meth)acrylate, methoxypolypropylene glycol(meth)acrylate; acrylate monomers having a hetero ring, a halogen atom, a silicone atom or the like such as tetrahydrofurfuryl(meth)acrylate, fluoro(meth)acrylate, silicone (meth)acrylate; polyfunctional monomers such as hexanediol di(meth)acrylate, (poly)ethylene glycol di(meth)acrylate, (poly)propylene glycol di(meth)acrylate, neopentylglycol di(meth)acrylate, pentaerythritol di(meth)acrylate, trimethylolpropane tri (meth)acrylate, pentaerythritol tri(meth)acrylate, dipentaerythritol hexa(meth)acrylate, epoxyacrylate, polyester acrylate, urethane acrylate, divinylbenzene, butyl di(meth)acrylate, hexyl di(meth)acrylate, etc. One or more these copolymerizable monomer components may be used here either singly or as combined.

The radiation-curable pressure-sensitive adhesive (or energy ray-curable pressure-sensitive adhesive) (composition) usable in the invention includes, for example, an internal-type radiation-curable pressure-sensitive adhesive comprising, as the base polymer, a polymer having a radical-reactive carbon-carbon double bond in the polymer side chain, main chain or main chain terminal, and a radiation-curable pressure-sensitive adhesive prepared by incorporating a UV-curable monomer component or oligomer component in a pressure-sensitive adhesive. The thermally expandable pressure-sensitive adhesive also usable here includes, for example, those comprising a pressure-sensitive adhesive and a foaming agent (especially thermally expandable microspheres).

In the invention, the pressure-sensitive adhesive layer 32 may contain various additives (e.g., a tackifying resin, a coloring agent, a thickener, an extender, a filler, a plasticizer, an antiaging agent, an antioxidant, a surfactant, a crosslinking agent, etc.) within the range where the advantages of the invention are not impaired.

The crosslinking agent is not particularly restricted and known crosslinking agents can be used. Specifically, as the crosslinking agent, not only isocyanate-based crosslinking agents, epoxy-based crosslinking agents, melamine-based crosslinking agents, and peroxide-based crosslinking agents but also urea-based crosslinking agents, metal alkoxide-based crosslinking agents, metal chelate-based crosslinking agents, metal salt-based crosslinking agents, carbodiimide-based crosslinking agents, oxazoline-based crosslinking agents, aziridine-based crosslinking agents, amine-based crosslinking agents, and the like may be mentioned, and isocyanate-based crosslinking agents and epoxy-based crosslinking agents are suitable. The crosslinking agent may be employed singly or in a combination of two or more kinds. Incidentally, the amount of the crosslinking agent to be used is not particularly restricted.

Examples of the isocyanate-based crosslinking agents include lower aliphatic polyisocyanates such as 1,2-ethylene diisocyanate, 1,4-butylene diisocyanate, and 1,6-hexamethylene diisocyanate; alicyclic polyisocyanates such as cyclopentylene diisocyanate, cyclohexylene diisocyanate, isophorone diisocyanate, hydrogenated tolylene diisocyanate, and hydrogenated xylylene diisocyanate; and aromatic polyisocyanates such as 2,4-tolylene diisocyanate, 2,6-tolylene diisocyanate, 4,4'-diphenylmethane diisocyanate, and xylylene diisocyanate. In addition, a trimethylolpropane/tolylene diisocyanate trimer adduct [a trade name "COLONATE L" manufactured by Nippon Polyurethane Industry Co., Ltd.], a trimethylolpropane/hexamethylene diisocyanate trimer adduct [a trade name "COLONATE HL" manufactured by Nippon Polyurethane Industry Co., Ltd.], and the like are also used. Moreover, examples of the epoxy-based crosslinking agents include N,N,N',N'-tetraglycidyl-m-xylenediamine, diglycidylaniline, 1,3-bis(N,N-glycidylaminomethyl)cyclohexane, 1,6-hexanediol diglycidyl ether, neopentyl glycol diglycidyl ether, ethylene glycol diglycidyl ether, propylene glycol diglycidyl ether, polyethylene glycol diglycidyl ether, polypropylene glycol diglycidyl ether, sorbitol polyglycidyl ether, glycerol polyglycidyl ether, pentaerythritol polyglycidyl ether, polyglycerol polyglycidyl ether, sorbitan polyglycidyl ether, trimethylolpropnane polyglycidyl ether, adipic acid diglycidyl ester, o-phthalic acid diglycidyl ester, triglycidyl-tris(2-hydroxyethyl)isocyanurate, resorcin diglycidyl ether, and bisphenol-S-diglycidyl ether, and also epoxy-based resins having two or more epoxy groups in the molecule.

In place of using the crosslinking agent or along with the crosslinking agent in the invention, the pressure-sensitive adhesive layer may be crosslinked through irradiation with electron rays or UV rays.

The pressure-sensitive adhesive layer 32 can be, for example, formed by utilizing a commonly used method including mixing a pressure-sensitive adhesive and optional solvent and other additives and then shaping the mixture into a sheet-like layer. Specifically, for example, there may be mentioned a method including applying a mixture containing a pressure-sensitive adhesive and optional solvent and other additives on the base material 31; a method including applying the foregoing mixture on an appropriate separator (such as a release paper) to form a pressure-sensitive adhesive layer 32 and then transferring (transcribing) it on the base material 31; or the like.

The adhesive force of the pressure-sensitive adhesive layer 32 of the dicing tape 3 to the film for flip chip type semiconductor back surface 2 (23° C., peeling angle of 180 degrees, peeling rate of 300 mm/min) is preferably within a range of from 0.02 N/20 mm to 10 N/20 mm, more preferably from 0.05 N/20 mm to 5 N/20 mm. When the adhesive force is at least 0.02 N/20 mm, then the semiconductor chips may be prevented from flying away in dicing semiconductor wafer. On the other hand, when the adhesive force is at most 10 N/20 mm, then it facilitates peeling of semiconductor chips in picking up them, and prevents the pressure-sensitive adhesive from remaining Incidentally, in the invention, the film 2 for flip-chip type semiconductor back surface or the dicing tape-integrated film 1 for semiconductor back surface can be made to have an antistatic function. Owing to this configuration, the circuit can be prevented from breaking down due to the generation of electrostatic energy at the time adhesion and at the time of peeling thereof or due to charging of a semiconductor wafer or the like by the electrostatic energy. Imparting of the antistatic function can be performed by an appropriate manner such as a method of adding an antistatic agent or a conductive substance to the base material 31, the pressure-sensitive adhesive layer 32, and the film for semiconductor back surface 2, or a method of providing a conductive layer composed of a charge-transfer complex, a metal film, or the like onto the base material 31. As these methods, a method in which an impurity ion having a fear of changing quality of the semiconductor wafer is difficult to generate is preferable. Examples of the conductive substance (conductive filler) to be blended for the purpose of imparting conductivity, improving thermal conductivity, and the like include a sphere-shaped, a needle-shaped, or a flake-shaped metal powder of silver, aluminum, gold, copper, nickel, a conductive alloy, or the like; a metal oxide such as alumina; amorphous carbon black, and graphite. However, the film for semiconductor back surface 2 is preferably non-conductive from the viewpoint of having no electric leakage.

Moreover, the film 2 for flip-chip type semiconductor back surface or the dicing tape-integrated film 1 for semiconductor back surface may be formed in a form where it is wound as a roll or may be formed in a form where the sheet (film) is laminated. For example, in the case where the film has the form where it is wound as a roll, the film is wound as a roll in a state that the film 2 for semiconductor back surface or the laminate of the film 2 for semiconductor back surface and the dicing tape 3 is protected by a separator according to needs, whereby the film can be prepared as a film 2 for semiconductor back surface or a dicing tape-integrated film 1 for semiconductor back surface in a state or form where it is wound as a roll. In this regard, the dicing tape-integrated film 1 for semiconductor back surface in the state or form where it is wound as a roll may be constituted by the base material 31, the pressure-sensitive adhesive layer 32 formed on one surface of the base material 31, the film 2 for semiconductor back surface formed on the pressure-sensitive adhesive layer 32, and a releasably treated layer (rear surface treated layer) formed on the other surface of the base material 31.

Incidentally, the thickness of the dicing tape-integrated film 1 for semiconductor back surface (total thickness of the thickness of the film for semiconductor back surface and the thickness of the dicing tape including the base material 31 and the pressure-sensitive adhesive layer 32) can be, for example, selected from the range of 25 µm to 1,600 µm and it is preferably from 30 µm to 850 µm more preferably 35 µm to 500 µm and particularly preferably 50 µm to 330 µm.

In this regard, in the dicing tape-integrated film 1 for semiconductor back surface, by controlling the ratio of the thickness of the film 2 for semiconductor back surface to the thickness of the pressure-sensitive adhesive layer 32 of the dicing tape 3 or the ratio of the thickness of the film 2 for semiconductor back surface to the thickness of the dicing tape (total thickness of the base material 31 and the pressure-sensitive adhesive layer 32), a dicing property at the dicing step, a picking-up property at the picking-up step, and the like can be improved and the dicing tape-integrated film for semiconductor back surface 1 can be effectively utilized from the dicing step of the semiconductor wafer to the flip chip bonding step of the semiconductor chip.

(Producing Method of Dicing Tape-Integrated Film for Semiconductor Back Surface)

The producing method of the dicing tape-integrated film for semiconductor back surface according to the present embodiment is described while using the dicing tape-integrated film for semiconductor back surface 1 shown in FIG. 1 as an example. First, the base material 31 can be formed by a conventionally known film-forming method. Examples of the film-forming method include a calendar film-forming method, a casting method in an organic solvent, an inflation extrusion method in a closely sealed system, a T-die extrusion method, a co-extrusion method, and a dry laminating method.

Next, the pressure-sensitive adhesive composition is applied to the base material 31 and dried thereon (and optionally crosslinked under heat) to form the pressure-sensitive adhesive layer 32. The coating system includes roll coating, screen coating, gravure coating, etc. The pressure-sensitive adhesive composition may be directly applied to the base material 31 to form the pressure-sensitive adhesive layer 32 on the base material 31; or the pressure-sensitive adhesive composition may be applied to a release sheet or the like of which the surface has been processed for lubrication, to form the pressure-sensitive adhesive layer 32 thereon, and the pressure-sensitive adhesive layer 32 may be transferred onto the base material 31. With that, the dicing tape 3 is formed having the pressure-sensitive adhesive layer 32 formed on the base material 31.

The dicing tape-integrated film 1 for semiconductor back surface according to the invention can be obtained by transferring the film 2 for flip chip type semiconductor back surface prepared by the above-mentioned procedure onto the pressure-sensitive adhesive layer 32 of the resulting dicing tape 3. In this case, the film 2 for semiconductor back surface is transferred to the dicing tape 3 in such a manner that the protective layer 22 of the film 2 for semiconductor back surface faces the pressure-sensitive adhesive layer 32.

The dicing tape-integrated film 1 for semiconductor back surface of the invention can be suitably used at the production of a semiconductor device including the flip chip connection step. Namely, the dicing tape-integrated film 1 for semiconductor back surface of the invention is used at the production of a flip chip-mounted semiconductor device and thus the flip chip-mounted semiconductor device is produced in a condition or form where the film 2 for semiconductor back surface of the dicing tape-integrated film 1 for semiconductor back surface is attached to the back surface of the semiconductor chip. Therefore, the dicing tape-integrated film 1 for semiconductor back surface of the invention can be used for a flip chip-mounted semiconductor device (a semiconductor device in a state or form where the semiconductor chip is fixed to an adherend such as a substrate by a flip chip bonding method).

The film 2 for semiconductor back surface is usable also for flip chip-mounted semiconductor devices (semiconductor devices in a state or form where a semiconductor chip is fixed to the adherend such as a substrate or the like in a flip chip bonding method), like in the dicing tape-integrated film 1 for semiconductor back surface.

(Semiconductor Wafer)

The semiconductor wafer is not particularly restricted as long as it is a known or commonly used semiconductor wafer and can be appropriately selected and used among semiconductor wafers made of various materials. In the invention, as the semiconductor wafer, a silicon wafer can be suitable used.

(Production Process of Semiconductor Device)

The process for producing a semiconductor device according to the invention will be described referring to FIGS. 3A to 3D. FIGS. 3A to 3D are cross-sectional schematic views showing a process for producing a semiconductor device in the case where a dicing tape-integrated film for semiconductor back surface 1 is used.

According to the above-mentioned semiconductor device production method, the semiconductor device can be produced using the above-mentioned dicing tape-integrated film 1 for semiconductor back surface. Specifically, the method comprises at least a step of attaching a semiconductor wafer onto the film for flip chip type semiconductor back surface in the dicing tape-integrated film for semiconductor back surface, a step of dicing the semiconductor wafer to form a semiconductor element, a step of peeling the semiconductor element together with the film for flip chip type semiconductor back surface from the pressure-sensitive adhesive layer of the dicing tape, a step of adhering a flux to a connecting member for an adherend in the semiconductor element, and a step of flip chip-connecting the semiconductor element onto the adherend.

(Mounting Step)

Figure 3A:
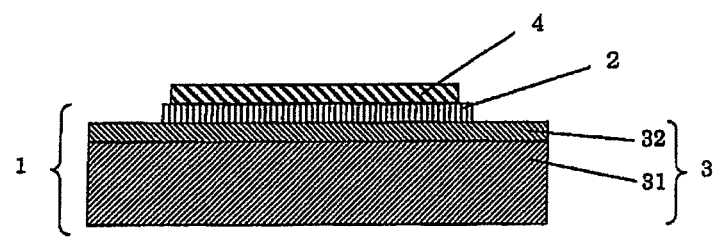
FIGS. 3A to 3D are cross-sectional schematic views showing one embodiment of a method for producing a semiconductor device using a dicing tape-integrated film for semiconductor back surface of the invention.

First, as shown in FIG. 3A, a separator optionally provided on the film 2 for semiconductor back surface of the dicing tape-integrated film 1 for semiconductor back surface is suitably peeled off and the semiconductor wafer 4 is attached onto the film 2 for semiconductor back surface to be fixed by adhesion and holding (mounting step). On this occasion, the film 2 for semiconductor back surface is in an uncured state (including a semi-cured state). Moreover, the dicing tape-integrated film 1 for semiconductor back surface is attached to the back surface of the semiconductor wafer 4. The back surface of the semiconductor wafer 4 means a face opposite to the circuit face (also referred to as non-circuit face, non-electrode-formed face, etc.). The attaching method is not particularly restricted but a method by press bonding is preferred. The press bonding is usually performed while pressing with a pressing means such as a pressing roll.

(Dicing Step)

Figure 3B:
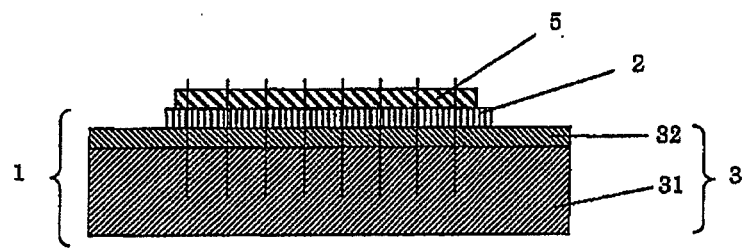

Next, as shown in FIG. 3B, the semiconductor wafer 4 is diced. Thereby, the semiconductor wafer 4 is cut into a prescribed size and individualized (is formed into small pieces) to produce semiconductor chips 5. The dicing is performed according to a normal method from the circuit face side of the semiconductor wafer 4, for example. Moreover, the present step can adopt, for example, a cutting method called full-cut that forms a slit reaching the dicing tape-integrated film 1 for semiconductor back surface. The dicing apparatus used in the present step is not particularly restricted, and a conventionally known apparatus can be used. Further, since the semiconductor wafer 4 is adhered and fixed by the dicing tape-integrated film 1 for semiconductor back surface having the film for semiconductor back surface, chip crack and chip fly can be suppressed, as well as the damage of the semiconductor wafer 4 can also be suppressed. In this regard, when the film 2 for semiconductor back surface is formed of a resin composition containing an epoxy resin, generation of adhesive extrusion from the adhesive layer of the film for semiconductor back surface can be suppressed or prevented at the cut surface even when it is cut by dicing. As a result, re-attachment (blocking) of the cut surfaces themselves can be suppressed or prevented and thus the picking-up to be mentioned below can be further conveniently performed.

In the case where the dicing tape-integrated film 1 for semiconductor back surface is expanded, the expansion can be performed using a conventionally known expanding apparatus. The expanding apparatus has a doughnut-shaped outer ring capable of pushing the dicing tape-integrated film 1 for semiconductor back surface downward through a dicing ring and an inner ring which has a diameter smaller than the outer ring and supports the dicing tape-integrated film for semiconductor back surface. Owing to the expanding step, it is possible to prevent the damage of adjacent semiconductor chips through contact with each other in the picking-up step to be mentioned below.

(Picking-Up Step)

Figure 3C:
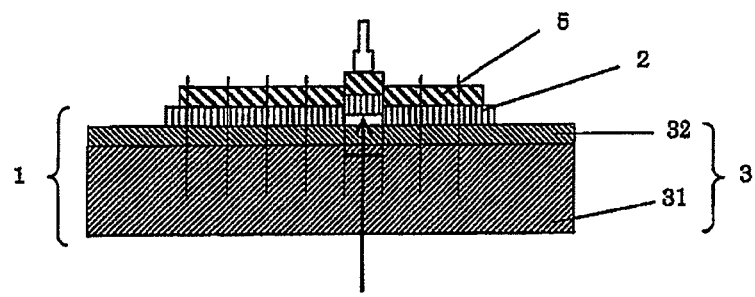

In order to collect the semiconductor chip 5 that is adhered and fixed to the dicing tape-integrated film 1 for semiconductor back surface, picking-up of the semiconductor chip 5 is performed as shown in FIG. 3C to peel the semiconductor chip 5 together with the film 2 for semiconductor back surface from the dicing tape 3. The method of picking-up is not particularly restricted, and conventionally known various methods can be adopted. For example, there may be mentioned a method including pushing up each semiconductor chip 5 from the base material 31 side of the dicing tape-integrated film 1 for semiconductor back surface with a needle and picking-up the pushed semiconductor chip 5 with a picking-up apparatus. In this regard, the back surface of the picked-up semiconductor chip 5 is protected with the film 2 for semiconductor back surface.

(Flip Chip Connection Step)

Figure 3D:
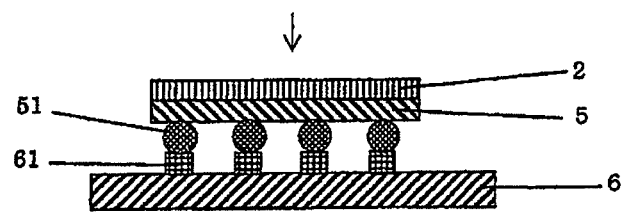

The picked-up semiconductor chip 5 is fixed to an adherend such as a substrate by a flip chip bonding method (flip chip mounting method) as shown in FIG. 3D. Specifically, the semiconductor chip 5 is first fixed to the adherend 6 according to a usual manner in a form where a circuit face (also referred to as a front face, a circuit-pattern formed face, an electrode-formed face or the like) is opposed to the adherend 6. For example, a bump 51 formed as the connecting member on the circuit face side of the semiconductor chip 5 is brought into contact with the flux to allow the flux to adhere to the bump 51. Then, the bump 51 of the semiconductor chip 5 is brought into contact with a conductive material (such as solder) 61 for connection adhered to a connection pad of the adherend 6, and the bump 51 and the conductive material are melted under pressure, whereby electric connection between the semiconductor chip 5 and the adherend 6 can be secured and the semiconductor chip 5 can be fixed to the adherend 6 (flip chip bonding step). On this occasion, gaps are formed between the semiconductor chip 5 and the adherend 6, and the distance between the gaps is generally from about 30 to 300 μm. Incidentally, after the flip chip bonding (flip chip connection) of the semiconductor chip 5 to the adherend 6, it is important that the flux remaining on the opposing faces of the semiconductor chip 5 and the adherend 6 or in the gaps therebetween is removed by washing, followed by filling the gaps with an encapsulating material (such as an encapsulating resin) to perform encapsulation.

As the adherend 6, various substrates such as lead frames and circuit boards (such as wiring circuit boards) can be used. The material of the substrates is not particularly restricted and there may be mentioned ceramic substrates and plastic substrates. Examples of the plastic substrates include epoxy substrates, bismaleimide triazine substrates, and polyimide substrates.

In the flip chip bonding step, the material of the bump and the conductive material is not particularly restricted and examples thereof include solders (alloys) such as tin-lead-based metal materials, tin-silver-based metal materials, tin-silver-copper-based metal materials, tin-zinc-based metal materials, and tin-zinc-bismuth-based metal materials, and gold-based metal materials and copper-based metal materials.

Incidentally, in the flip chip bonding step, the conductive material is melted to connect the bump at the circuit face side of the semiconductor chip 5 and the conductive material on the surface of the adherend 6. The temperature at the melting of the bump and the conductive material is usually about 260° C. (e.g., 250° C. to 300° C.). The dicing tape-integrated film for semiconductor back surface of the invention can be made to have thermal resistance capable of enduring the high temperature in the flip chip bonding step by forming the film for semiconductor back surface with an epoxy resin or the like.

In the present step, it is preferred to wash the opposing face (electrode-formed face) between the semiconductor chip 5 and the adherend 6 and the gaps. The washing liquid to be used at the washing is not particularly restricted and examples thereof include organic washing liquids and aqueous washing liquids. The film for semiconductor back surface in the dicing tape-integrated film for semiconductor back surface of the invention has solvent resistance against the washing liquid and has substantially no solubility to these washing liquid. Therefore, as mentioned above, various washing liquids can be employed as the washing liquid and the washing can be achieved by any conventional method without requiring any special washing liquid.

In the semiconductor device production method of the invention, the flip chip bonding step is performed using the film for semiconductor back surface provided with the protective layer, so that the flux for soldering does not remain in the film for semiconductor back surface, even when the flux adheres to the back surface of the semiconductor chip, thereby being able to prevent the occurrence of the flux-derived stains.

Next, an encapsulation step is performed for encapsulating the gaps between the flip chip-bonded semiconductor chip 5 and the adherend 6. The encapsulation step is performed using an encapsulating resin. The encapsulation conditions on this occasion are not particularly restricted but the curing of the encapsulating resin is usually carried out at 175° C. for 60 seconds to 90 seconds. However, in the invention, without limitation thereto, the curing may be performed at a temperature of 165 to 185° C. for several minutes, for example. By the thermal treatment in this step, not only the encapsulating resin but also the film for semiconductor back surface 2 is also thermally cured at the same time. Accordingly, both the encapsulating resin and the film for semiconductor back surface 2 are cured and shrunk with the procedure of the thermal curing. As a result, the stress to be given to the semiconductor chip 5 owing to the curing shrinkage of the encapsulating resin can be cancelled or relaxed through curing shrinkage of the film for semiconductor back surface 2. Moreover, in the step, the film for semiconductor back surface 2 can be completely or almost completely thermally cured and can be attached to the back surface of the semiconductor element with excellent close adhesiveness. Further, the film for semiconductor back surface 2 according to the invention can be thermally cured together with the encapsulating material in the encapsulation step even when the film is in an uncured state, so that it is not necessary to newly add a step for thermal curing of the film for semiconductor back surface 2.

The encapsulating resin is not particularly restricted as long as the material is a resin having an insulating property (an insulating resin) and may be suitably selected and used among known encapsulating materials such as encapsulating resins. The encapsulating resin is preferably an insulating resin having elasticity. Examples of the encapsulating resin include resin compositions containing an epoxy resin. As the epoxy resin, there may be mentioned the epoxy resins exemplified in the above. Furthermore, the encapsulating resin composed of the resin composition containing an epoxy resin may contain a thermosetting resin other than an epoxy resin (such as a phenol resin) or a thermoplastic resin in addition to the epoxy resin. Incidentally, a phenol resin can be utilized also as a curing agent for the epoxy resin and, as such a phenol resin, there may be mentioned phenol resins exemplified in the above.

According to the semiconductor device (flip chip-mounted semiconductor device) manufactured using the dicing tape-integrated film 1 for semiconductor back surface or the film 2 for semiconductor back surface, the film for semiconductor back surface is attached to the back surface of the semiconductor chip, and therefore, laser marking can be applied with excellent visibility. In particular, even when the marking method is a laser marking method, laser marking can be applied with an excellent contrast ratio, and it is possible to observe various kinds of information (for example, literal information and graphical information) applied by laser marking with good visibility. At the laser marking, a known laser marking apparatus can be utilized. Moreover, as the laser, it is possible to utilize various lasers such as a gas laser, a solid-state laser, and a liquid laser. Specifically, as the gas laser, any known gas lasers can be utilized without particular limitation but a carbon dioxide laser ($CO_2$ laser) and an excimer laser (ArF laser, KrF laser, XeCl laser, XeF laser, etc.) are suitable. As the solid-state laser, any known solid-state lasers can be utilized without particular limitation but a YAG laser (such as Nd:YAG laser) and a $YVO_4$ laser are suitable.

Since the semiconductor device produced using the dicing tape-integrated film 1 for semiconductor back surface or the film 2 for semiconductor back surface of the invention is a semiconductor device mounted by the flip chip mounting method, the device has a thinned and miniaturized shape as compared with a semiconductor device mounted by a die-bonding mounting method. Thus, the semiconductor devices can be suitably employed as various electronic devices and electronic parts or materials and members thereof. Specifically, as the electronic devices in which the flip chip-mounted semiconductor devices of the invention are utilized, there may be mentioned so-called "mobile phones" and "PHS", small-sized computers [e.g., so-called "PDA" (handheld terminals), so-called "notebook-sized personal computer", so-called "Net Book (trademark)", and so-called "wearable computers", etc.], small-sized electronic devices having a form where a "mobile phone" and a computer are integrated, so-called "Digital Camera (trademark)", so-called "digital video cameras", small-sized television sets, small-sized game machines, small-sized digital audio players, so-called "electronic notepads", so-called "electronic dictionary", electronic device terminals for so-called "electronic books", mobile electronic devices (portable electronic devices) such as small-sized digital type watches, and the like. Needless to say, electronic devices (stationary type ones, etc.) other than mobile ones, e.g., so-called "desktop personal computers", thin type television sets, electronic devices for recording and reproduction (hard disk recorders, DVD players, etc.), projectors, micromachines, and the like may be also mentioned. In addition, electronic parts or materials and members for electronic devices and electronic parts are not particularly restricted and examples thereof include parts for so-called "CPU" and members for various memory devices (so-called "memories", hard disks, etc.).

EXAMPLES

The following will illustratively describe preferred Examples of the invention in detail. However, the invention is not limited to the following Examples unless it exceeds the gist thereof. Moreover, part in each example is a weight standard unless otherwise stated.
<Preparation of Adhesive Layer>
113 parts of an epoxy resin (trade name: "Epicoat 1004", manufactured by JER Co., Ltd.), 121 parts of a phenol resin (trade name: "Milex XLC-4L", manufactured by Mitsui Chemicals, Inc.), 246 parts of spherical silica (trade name: "SO-25R", manufactured by Admatechs Co., Ltd.), 5 parts of dye 1 (trade name: "OIL GREEN 502", manufactured by Orient Chemical Industries Co., Ltd.) and 5 parts of dye 2 (trade name: "OIL BLACK BS", manufactured by Orient Chemical Industries Co., Ltd.) based on 100 parts of an acrylic ester-based polymer mainly composed of ethyl acrylate-methyl methacrylate (trade name: "Paracron W-197CM", manufactured by Negami Chemical Industrial Co., Ltd.) were dissolved in methyl ethyl ketone to prepare an adhesive composition solution having a solid concentration of 23.6% by weight.
This adhesive composition solution was applied onto a release-treated film as a release liner (separator), which was formed of a 50 μm-thick polyethylene terephthalate film subjected to a silicone release treatment, and then dried at 130° C. for 2 minutes to prepare an adhesive layer A having a thickness (average thickness) of 10 μm.

Example 1

<Preparation of Film for Semiconductor Back Surface>
The resulting adhesive layer A was attached to a 10 μm-thick aluminum foil (manufactured by Toyo Aluminum K.K., 1N30) as a protective layer under conditions of an attaching angle of 120°, a pressure of 0.2 MPa and a speed of 10 mm/s to prepare a film for semiconductor back surface.

Example 2

<Preparation of Film for Semiconductor Back Surface>
The resulting adhesive layer A was attached to a 12.5 μm-thick polyimide film (Apical, manufactured by Kaneka Corporation, glass transition temperature (Tg): 240° C.) as a protective layer under conditions of an attaching angle of 120°, a pressure of 0.2 MPa and a speed of 10 mm/s to prepare a film for semiconductor back surface.

Comparative Example 1

In accordance with the procedure of "Preparation of Adhesive Layer" described above, an adhesive layer having a thickness (average thickness) of 20 μm was prepared, and this adhesive layer was used as a film for semiconductor back surface without being provided with a protective layer.
<Preparation of Dicing Tape-Integrated Film for Semiconductor Back Surface>
Each of the films for semiconductor back surface obtained in Examples and Comparative Example was attached onto a pressure-sensitive adhesive layer of a dicing tape (trade name: "V-8-T", manufactured by Nitto Denko Corporation, average thickness of base material: 65 μm, average thickness of pressure-sensitive adhesive layer: 10 μm) by using a hand roller to prepare a dicing tape-integrated film for semiconductor back surface.
(Evaluation of Flux Staining Property)
A semiconductor wafer (diameter: 8 inches, thickness: 0.6 mm, silicon minor wafer) was subjected to a back surface polishing treatment, and a mirror wafer having a thickness of 0.2 mm was used as a work. After the separator was peeled from the dicing tape-integrated film for semiconductor back surface, the mirror wafer (work) was attached onto the film for semiconductor back surface at 70° C. by roll pressing. Incidentally, semiconductor wafer polishing conditions and attaching conditions were as follows:
(Semiconductor Wafer Polishing Conditions)
Polishing apparatus: trade name: "DFG-8560", manufactured by DISCO Corporation
Semiconductor wafer: 8 inches in diameter (back surface polishing from a thickness of 0.6 mm to a thickness of 0.2 mm)
(Attaching Conditions)
Attaching apparatus: trade name: "MA-3000III", manufactured by Nitto Seiki Co., Ltd.
Attaching speed: 10 mm/min
Attaching pressure: 0.15 MPa
Stage temperature in attaching: 70° C.
A drop of a flux (RM-26-20, manufactured by TAMURA Corporation) was dropped with a dropper onto the film for semiconductor back surface attached to the semiconductor wafer, and a reflow step was performed under lead solder conditions defined by JEDEC. The flux staining property was evaluated, taking as "good" the case where no stain occurred and as "poor" the case where a stain occurred. The results thereof are shown in Table 1.
(Reflow Conditions)
Temperature: the peak temperature was 260° C.
Time: the time at the peak temperature was 30 seconds.

TABLE 1

|  | Protective Layer | Flux Staining Property |
| --- | --- | --- |
| Example 1 | Aluminum | Good |
| Example 2 | polyimide | Good |
| Comparative Example 1 | Not provided | Poor |

As apparent from Table 1, no flux-derived stain occurred in the dicing tape-integrated films for semiconductor back surface according to Examples 1 and 2, and the appearance properties of the films for semiconductor back surface was good. On the other hand, flux-derived stains occurred in the film for semiconductor back surface of Comparative Example 1, resulting in showing poor appearance properties.
While the present invention has been described in detail and with reference to specific embodiments thereof, it will be apparent to one skilled in the art that various changes and modifications can be made therein without departing from the scope thereof.

This application is based on Japanese patent application No. 2010-170807 filed Jul. 29, 2010, the entire contents thereof being hereby incorporated by reference.

What is claimed is:

1. A film for flip chip type semiconductor back surface, which is to be disposed on a back surface of a semiconductor element flip chip-connected onto an adherend,
the film for flip chip type semiconductor back surface comprising an adhesive layer and a protective layer laminated on the adhesive layer,
wherein a tensile storage elastic modulus of the adhesive layer in an uncured state at 23° C. is 1 GPA to 50 GPa,
wherein the protective layer is composed of a metal,
wherein the metal is at least one selected from the group consisting of aluminum, aluminate, stainless steel, iron, titanium, tin and copper,
wherein the protective layer has a thickness of 2 to 200 µm,
wherein the adhesive layer contains an epoxy resin, an acrylic resin, and a colorant, and
wherein the epoxy resin is a thermosetting resin.

2. The film for flip chip type semiconductor back surface according to claim 1, wherein a surface of the protective layer on the adhesive layer side has been subjected to at least a surface activation treatment selected from the group consisting of a plasma treatment, an ozone water treatment, an ultraviolet ozone treatment and an ion beam treatment.

3. A dicing tape-integrated film for semiconductor back surface, which comprises:
a dicing tape comprising a base material and a pressure-sensitive adhesive layer laminated on the base material, and
the film for flip chip type semiconductor back surface according to claim 1, which is laminated on the pressure-sensitive adhesive layer so that the protective layer faces the pressure-sensitive adhesive layer.

4. A dicing tape-integrated film for semiconductor back surface, which comprises:
a dicing tape comprising a base material and a pressure-sensitive adhesive layer laminated on the base material, and
the film for flip chip type semiconductor back surface according to claim 2, which is laminated on the pressure-sensitive adhesive layer so that the protective layer faces the pressure-sensitive adhesive layer.

* * * * *